(12) United States Patent
Lin et al.

(10) Patent No.: US 8,751,978 B2
(45) Date of Patent: Jun. 10, 2014

(54) BALANCING MASK LOADING

(71) Applicant: Taiwan Semiconductor Manufacturing Company Limited, Hsin-Chu (TW)

(72) Inventors: HungLung Lin, Hsinchu (TW); Chin-Chang Hsu, Banqiao (TW); Wen-Ju Yang, Hsinchu (TW); C. R. Hsu, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/656,045

(22) Filed: Oct. 19, 2012

(65) Prior Publication Data
US 2014/0068528 A1    Mar. 6, 2014

Related U.S. Application Data

(60) Provisional application No. 61/695,651, filed on Aug. 31, 2012.

(51) Int. Cl.
*G06F 17/50* (2006.01)

(52) U.S. Cl.
USPC .................. 716/54; 716/53; 716/55; 716/139

(58) Field of Classification Search
CPC ............ G06F 17/5081; G06F 17/5045; G06F 17/5072
USPC .............................. 716/50–55, 139; 430/5, 30
See application file for complete search history.

(56) References Cited

U.S. PATENT DOCUMENTS

| 7,694,258 | B1 * | 4/2010 | Ylinen et al. ................. 716/119 |
| 2004/0098688 | A1 * | 5/2004 | Vuong et al. ..................... 716/8 |
| 2006/0200790 | A1 | 9/2006 | Shang et al. |
| 2009/0055792 | A1 * | 2/2009 | Itagaki ........................... 716/13 |

* cited by examiner

*Primary Examiner* — Nghia Doan
(74) *Attorney, Agent, or Firm* — Cooper Legal Group LLC

(57) ABSTRACT

Among other things, one or more techniques for balancing mask loading are provided herein. In some embodiments, a dummy mask assignment is assigned to a dummy within a mask layout based on an area of a polygon within the mask layout. In some embodiments, the dummy mask comprising the dummy mask assignment is inserted in the mask layout. In some embodiments, a window is created such that dummies within the window receive dummy mask assignments. In some embodiments, a halo is created such that the area of the polygon is determined based on the halo. Additionally, in some examples, the window and halo are shifted around the mask layout. In this manner, balanced mask loading is provided, thus enhancing a yield associated with the mask layout, for example.

20 Claims, 17 Drawing Sheets

BALANCING MASK LOADING

RELATED APPLICATION(S)

This application claims the benefit of U.S. Patent Application No. 61/695,651, filed on Aug. 31, 2012, entitled "BALANCING MASK LOADING" at least some of which is incorporated herein.

BACKGROUND

Generally, multiple patterning lithography (MPL) uses multiple masks to print layout geometries for a mask layout. Accordingly, a mask of the multiple masks comprises corresponding polygons, for example. Mask loading is a distribution of polygon area across the multiple masks. However, an uneven distribution or unbalanced mask loading is associated with process variation and a low yield, for example. Additionally, mask loading is generally addressed at a design phase, and it is often not possible for a designer to consider mask loading while maintaining layout quality or following design rules.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

Generally, multiple patterning lithography (MPL) is associated with one or more masks used to print layout geometries for a mask layout. As an example, a mask of the one or more masks comprises one or more polygons. Additionally, a polygon of the one or more polygons is used to print at least a portion of the layout geometries associated with the mask layout. However, when polygon distribution is uneven across the one or more masks, process variation and a low yield may occur. Accordingly, one or more techniques for balancing mask loading are provided herein. In some embodiments, a mask layout is received. As an example, the mask layout is associated with a first mask and a second mask. Additionally, the mask layout comprises one or more polygons, respective polygons comprise a mask assignment to at least one of the first mask, the second mask, or an undetermined assignment. In this example, a first polygon of the one or more polygons comprises a mask assignment to the first mask. In some embodiments, a first polygon area corresponding to the first mask is determined based on the first polygon comprising the mask assignment to the first mask. Accordingly, a first dummy mask assignment is assigned to a first dummy of one or more dummies in the mask layout based on the first polygon area. Generally, the first dummy mask assignment comprises at least one of an assignment to at least one of the one or more masks or an undetermined assignment. In this example, the first dummy mask assignment for the first dummy is assigned to the second mask at least because the first polygon comprises the mask assignment to the first mask. In other words, the first dummy mask assignment for the first dummy is assigned to the second mask to compensate for mask loading based on the first polygon area and the mask assignment of the first polygon. In some embodiments, if the first polygon area is ten units, and respective dummies are one unit of area, ten dummies are assigned dummy mask assignments to the second mask, for example. In this way, mask loading is balanced within a semiconductor processing environment.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
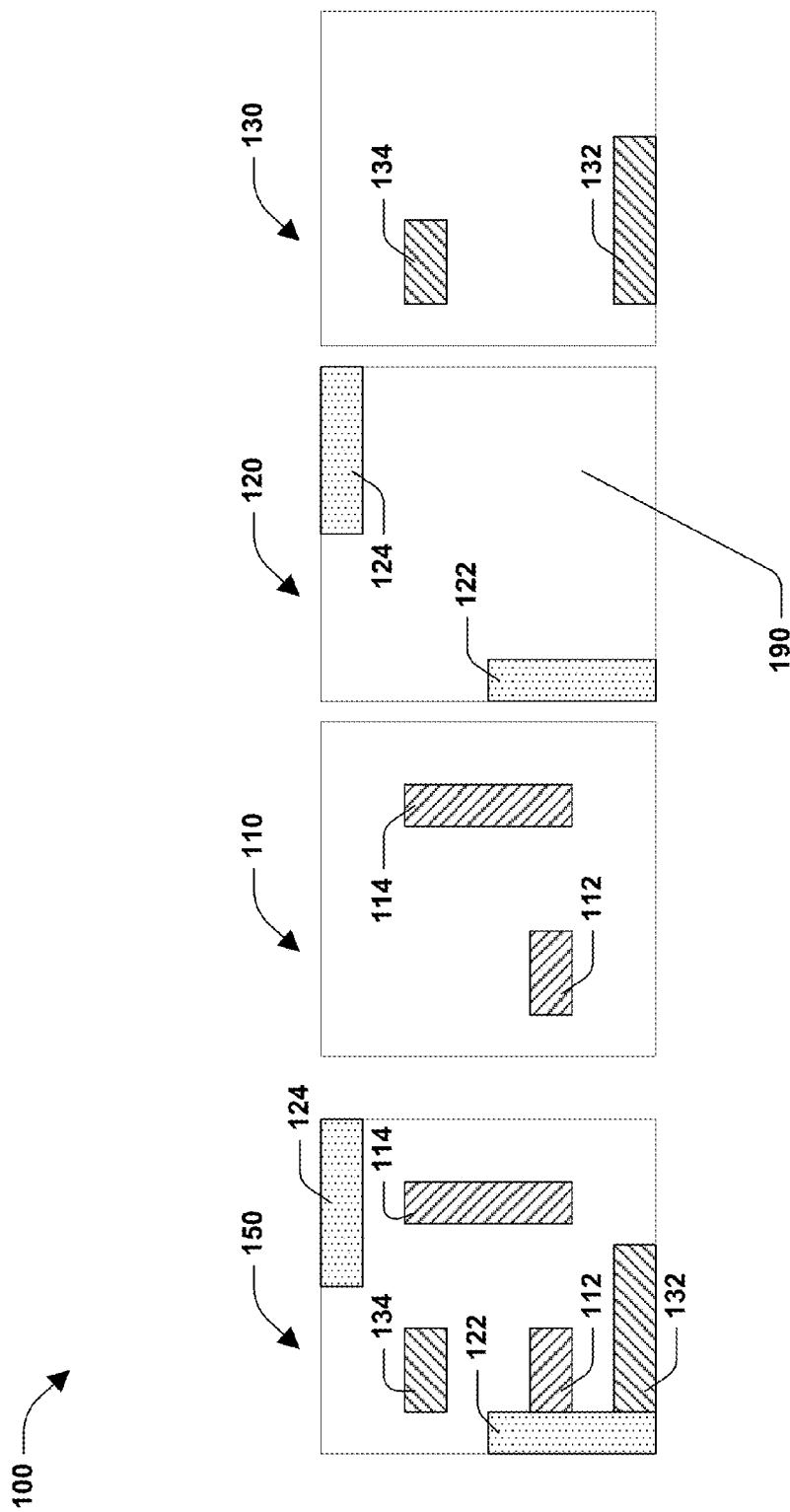
FIG. 1 is a top-down view of an example mask layout, according to some embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

FIG. 1 is a top-down view 100 of an example mask layout, according to some embodiments. In some embodiments, a mask layout 150 is provided or received. For example, the mask layout 150 of FIG. 1 is associated with a first mask 110, a second mask, 120, and a third mask 130. In some embodiments, the first mask 110, the second mask 120, and the third mask 130 are used for multiple patterning lithography (MPL). It will be appreciated that the mask layout 150 is a combination of layouts from the first mask 110, the second mask 120, and the third mask 130, for example. The first mask 110 comprises a first polygon 112 associated with one unit of area and a second polygon 114 associated with two units of area. The second mask 120 comprises a third polygon 122 associated with two units of area and a fourth polygon 124 associated with two units of area. The third mask 130 comprises a fifth polygon 132 associated with two units of area and a sixth polygon 134 associated with one unit of area. In some embodiments, the mask layout 150 comprises the first polygon 112, the second polygon 114, the third polygon 122, the fourth polygon 124, the fifth polygon 132, and the sixth polygon 134. Accordingly, the first mask 110 is associated with three units of area, the second mask 120 is associated with four units of area, and the third mask 130 is associated with three units of area. Therefore, the mask loading of the first mask 110, the second mask 120, and the third mask 130 is relatively even, and thus desirable at least because process variation and low yields are mitigated. In some embodiments, it is desirable to have mask loading such that a difference between polygon areas of two masks divided by a sum of the polygon areas of the two masks is less than fifteen percent.

For example, $|area(i)-area(j)|/(area(i)+area(j))<=15\%$, where area(i) is an area or total area of polygons for a first mask and area(j) is an area or total area of polygons for a second mask. In the example above, area(i)=3 and area(j)=4. Therefore $|(3-4)|/(3+4)=1/7=14.28\%$, which is desirable. However, in some scenarios, it is not possible to design respective masks to comprise such a desirable loading distribution or a desirable mask loading, for example. Accordingly, a dummy fill, dummy pattern, dummy polygon, or dummy is inserted into a mask to compensate for mask loading. In some examples, a dummy is inserted into an empty region, such as the empty region 190 in the second mask 120 of FIG. 1. It will be appreciated that the inserted dummy is subject to design rule checks (DRC) in some embodiments, for example. Additionally, the inserted dummy maintains a clearance distance from other dummies or polygons. It will be appreciated that in some embodiments, the dummy comprises a fixed dimension or space and does not impact a behavior of an original design of the mask layout 150.

Figure 2:
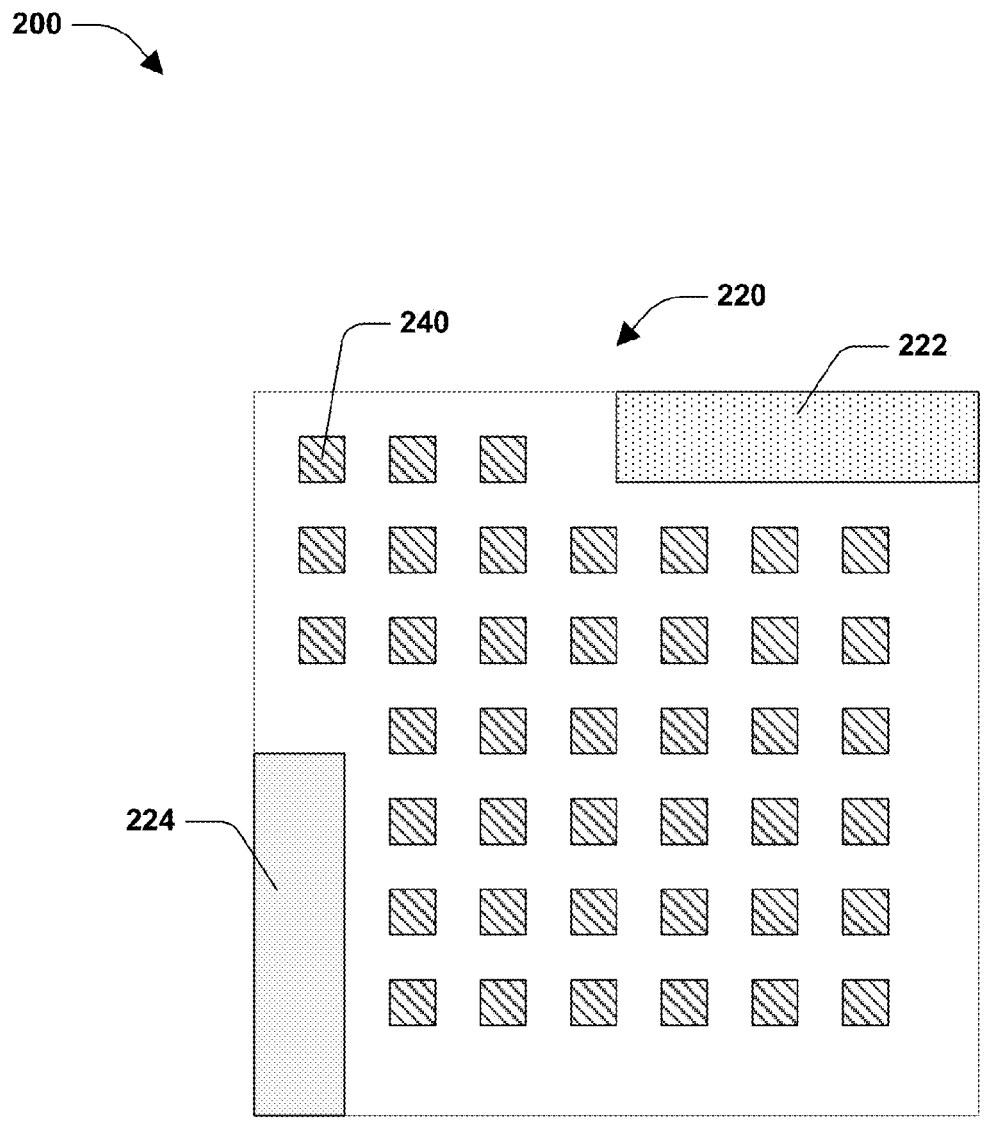
FIG. 2 is a top-down view of an example mask layout, according to some embodiments.

FIG. 2 is a top-down view 200 of an example mask layout, according to some embodiments. In some embodiments, a mask 220 comprises a similar layout to the second mask 120 of FIG. 1. For example, the mask 220 of FIG. 2 comprises a first polygon 222 and a second polygon 224. In this example, the mask 220 comprises a dummy 240 of one or more dummies. For example, the dummies of FIG. 2 are inserted into the empty region 190 of the second mask 120 of FIG. 1. Additionally, in some embodiments, mask 220 comprises merely a portion of a mask layout, such as the mask layout 150 of FIG. 1, for example. It will be appreciated that merely dummy 240 of the one or more dummies of mask 220 is labeled and are not all of the one or more dummies are labeled. For example, dummy 240 refers to at least one of the one or more of the dummies in some embodiments.

In some embodiments, the dummy 240 is inserted based on a partial mask assignment. A partial mask assignment is a scenario where not all of the polygons of a mask are assigned to a mask. For example, if the first polygon 222 comprises an undetermined assignment and the second polygon 224 comprises a mask assignment to a first mask, the mask layout of mask 220 is associated with a partial mask assignment. In some embodiments where a mask layout comprises a partial mask assignment, the dummy comprises at least one of a mask assignment to one of one or more masks of the mask layout or an undetermined assignment. For another example, if the first polygon 222 and the second polygon 224 both comprise an undetermined assignment, dummy 240 is assigned an undetermined assignment. In some embodiments, if the first polygon 222 and the second polygon 224 both comprise the undetermined assignment, dummy 240 is randomly assigned to at least one of the one or more masks. In other embodiments, dummy 240 is assigned to at least one of the one or more masks such that the mask layout results in an even distribution of dummies among the one or more masks.

In other embodiments, the dummy 240 is inserted based on a full mask assignment. A full mask assignment is a scenario where all of the polygons of a mask are assigned to a mask. For example, if the first polygon 222 comprises a mask assignment to a first mask and the second polygon 224 comprises a mask assignment to a second mask, the mask layout of mask 220 is associated with a full mask assignment. In some embodiments where a mask layout comprises a full mask assignment, the dummy comprises a mask assignment to one of one or more masks of the mask layout. For example, if the first polygon 222 comprises a mask assignment to a first mask of the one or more masks and the second polygon 224 comprises a mask assignment to a second mask of the one or more masks, dummy 240 is assigned a dummy mask assignment to at least one of the first mask or the second mask.

In some embodiments, the dummy 240 is inserted and assigned a dummy mask assignment concurrently based on a balance first approach, as will be described in further detail in FIG. 3. In other embodiments, the dummy 240 is inserted at a first time and assigned a dummy mask assignment at a second time after the first time based on a balance last approach, as will be described in further detail in FIG. 4.

Figure 3:
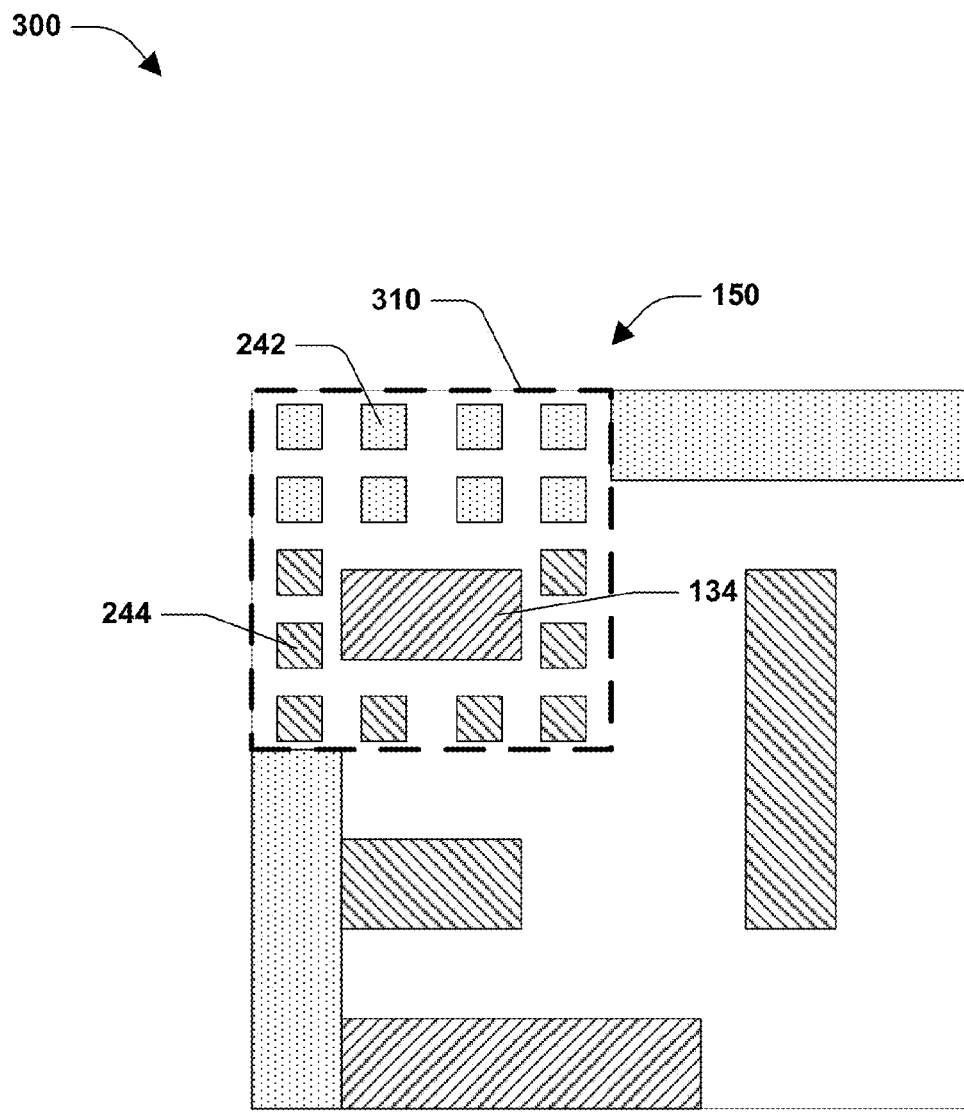
FIG. 3 is a top-down view of an example mask layout, according to some embodiments.

FIG. 3 is a top-down view 300 of an example mask layout, according to some embodiments. According to some aspects, dummy assignment or dummy insertion is achieved using windows within the mask layout. For example, the mask layout 150 of FIG. 3 is the same mask layout as the mask layout 150 of FIG. 1. In some embodiments, mask layout 150 comprises a sixth polygon 134. Additionally, a first window 310 comprising a first window size and a first window shape is created at a first location. Generally, the first window size is a size less than a mask size of the mask layout. In this example, the first window 310 encompasses the sixth polygon 134. In some embodiments, a first halo is created. In this example, the first halo is created at the first location and comprises a first halo size and a first halo shape such that the first halo overlaps the first window 310. In some examples, the first window 310 comprises an area where one or more dummies are inserted, such as during the balance first approach. Additionally, the first window 310 comprises an area where one or more dummy mask assignments are assigned. In some embodiments, the first halo comprises an area where a polygon area is determined. For example, the first halo encompasses at least a portion of the sixth polygon 134 when the first halo is at the first location.

In some embodiments, a third polygon area corresponding to the third mask is determined based on the sixth polygon 134 comprising a mask assignment to the third mask, the first halo at the first location, and the first halo size. In this example, the third polygon area is the area of the sixth polygon 134 at least because the sixth polygon 134 is encompassed within the first halo, which shares the same perimeter as the first window 310. As an example, the third polygon area comprises two units of area.

In some embodiments, the mask layout 150 of FIG. 3 is associated with one or more masks. For example, the mask layout 150 is associated with a first mask, a second mask, and a third mask. Therefore, FIG. 3 is an example of a mask layout 150 associated with a full mask assignment. Additionally, it is seen that FIG. 3 is an example of a balance first approach at least because dummies are inserted at the first window 310, rather than throughout the entire mask layout 150. In some embodiments, the mask layout 150 is associated with one or more polygons. For example, the sixth polygon 134 of the mask layout 150 is associated with the third mask, such as the third mask 130 of FIG. 1. In other words, the sixth polygon comprises a mask assignment to the third mask of the one or more masks associated with the mask layout 150. Accordingly, it is seen that the sixth polygon 134 occupies two units of area associated with the third mask within the first halo. In some embodiments, dummies are inserted to facilitate balancing of mask loading based on the first window 310 and the first halo. For example, sixteen dummies are inserted in the first window 310. A dummy of the sixteen dummies comprises one quarter of a unit of area. For example, dummy 242 and dummy 244 respectively comprise 0.25 units of area. In some embodiments, a dummy mask assignment is assigned to a dummy of one or more dummies in the mask layout 150 based on the third polygon area, the first window 310 at the first location, and the first window size. For example, eight of the sixteen dummies are assigned a dummy mask assignment to the first mask and the other eight of the sixteen dummies are assigned to a dummy mask assignment to the second mask at least because the third polygon area comprises two units of area associated with the third mask. For example, dummy 242 is assigned to the second mask and dummy 244 is assigned to the first mask. It will be appreciated that an area associated with the eight dummies comprising the dummy mask assignment to the second mask, such as dummy 242, is equal to two units of area, such as the third polygon area associated with the sixth polygon 134. Similarly, an area associated with the other eight dummies comprising the dummy mask assignment to the first mask, such as dummy 244, is also equal to two units of area. Accordingly, in this example, a dummy mask assignment comprises at least one of an assignment to the first mask or an assignment to the second mask. Therefore, the insertion of dummies or dummy pattern insertion within the first window 310 facilitates balancing of mask loading, for example. In this way, mask loading is balanced within a semiconductor processing environment.

It will be appreciated that dummy 242 refers to any of the dummies comprising the dummy mask assignment to the second mask, and that not all of the dummies comprising the dummy mask assignment to the second mask are labeled. For example, the dummies comprising a dotted fill pattern comprise the dummy assignment to the second mask. Similarly, dummy 244 refers to any of the dummies comprising the dummy mask assignment to the first mask, and that not all of the dummies comprising the dummy mask assignment to the first mask are labeled. For example, the dummies comprising a striped fill pattern, such as the striped fill pattern of dummy 244, comprise the dummy assignment to the first mask.

Figure 4:
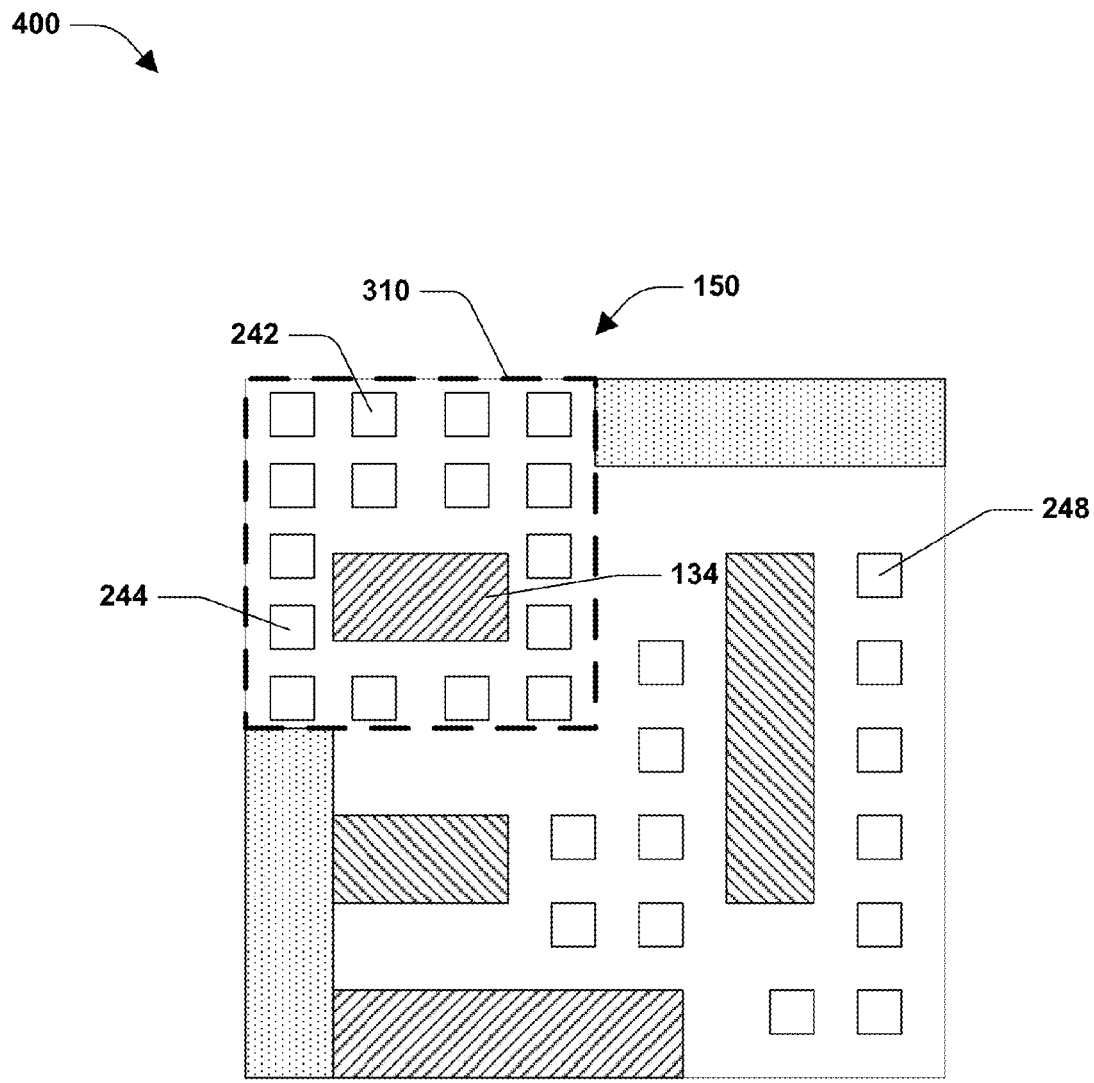
FIG. 4 is a top-down view of an example mask layout, according to some embodiments.

FIG. 4 is a top-down view 400 of an example mask layout, according to some embodiments. In some embodiments, dummy assignment or dummy insertion is achieved using windows within the mask layout. For example, the mask layout 150 of FIG. 4 is the same mask layout as the mask layout 150 of FIG. 3 or FIG. 1. In some embodiments, mask layout 150 comprises a sixth polygon 134, such as the sixth polygon 134 of FIG. 1. Additionally, a first window 310 comprising a first window size and a first window shape is created at a first location. Similarly, a first halo comprising a first halo size and a first halo shape is created at the first location. In this example, the first halo comprises a same perimeter or outline as the first window 310. In other words, the first halo overlaps the first window 310. Additionally, the first window 310 and the first halo both encompass the sixth polygon 134 in this example. In some embodiments, one or more dummies are inserted within the bounds of the first window 310. In other embodiments, the one or more dummies are assigned a dummy mask assignment. In FIG. 4, the one or more dummies, such as dummy 242, dummy 244, or dummy 248 comprise an undetermined assignment. Additionally, dummy 242 and dummy 244 are encompassed within the first window 310 and the first halo, while dummy 248 is not encompassed within the first window 310 or the first halo. It will be appreciated that dummy 242 or dummy 244 refers to any of the dummies encompassed within the first window 310 or the first halo, and that not all of the dummies encompassed within the first window 310 or the first halo are labeled. Similarly, dummy 248 refers to any of the dummies not encompassed by the first window 310 or the first halo, and that not all of the dummies not encompassed within the first window 310 or the first halo are labeled.

It will be appreciated that FIG. 4 is an example of a balance last approach, at least because the one or more dummies are inserted in mask layout 150 prior to balancing mask loading, for example. In other words, one or more dummies are inserted throughout the mask layout 150 during a first stage and assigned respective dummy mask assignments during a second stage, as will be described in further detail in FIG. 5. In some embodiments, FIG. 4 is an example of a mask layout with dummy insertion prior to dummy mask assignment or balancing mask loading. For example, the one or more dummies are inserted within the first window 310, such as dummy 242 or dummy 244 and outside of the first window 310, such as dummy 248. In other embodiments, such as a balance first approach, the one or more dummies are inserted and assigned respective dummy mask assignments concurrently. Additionally, in some embodiments, dummy insertion and dummy mask assignments are enabled merely within the first window 310. In other embodiments, dummy insertion and dummy mask assignments are enabled within the first window 310, a second window, a third window, etc. Accordingly, the one or more dummies are generally inserted within the first window 310 when following a balance first approach, such as the approach illustrated in FIG. 3. In some embodiments, the first window 310 is shifted from a first location to a second location, as will be described in further detail in FIG. 6.

In some embodiments, the first halo facilitates determination of a polygon area, a first polygon area, a second polygon area, a third polygon area, etc. For example, a set of polygons sharing a mask assignment to a same mask is analyzed within the first halo. In other words, merely a portion of the set of polygons sharing the mask assignment within the first halo is used to determine a polygon area. In FIG. 4, the mask layout 150 comprises one or more polygons associated with at least one of a first mask, a second mask, or a third mask. For example, a sixth polygon 134 of the one or more polygons comprises a mask assignment to the third mask. Additionally, the sixth polygon 134 is encompassed by the first halo. In some embodiments, the third polygon area is determined based on the sixth polygon 134 comprising the mask assignment to the third mask, the first halo at the first location, and the first halo size. For example, polygons within the first halo are analyzed to determine a number of different mask assignments. In this example, since merely the sixth polygon 134 is encompassed by the first halo, the number of different mask assignments is one. Accordingly, the mask assignment of the sixth polygon 134 is an assignment to the third mask. In some embodiments, one or more polygons encompassed by the first halo are analyzed to determine a set of one or more polygons sharing a mask assignment to a same mask. For example, if another polygon is encompassed by the first halo, and the other polygon comprises a mask assignment to the third mask, the sixth polygon 134 and the other polygon are in the set of polygons associated with the third mask. Accordingly, a polygon area, a first polygon area, a second polygon area, a third polygon area, etc. is determined for respective sets of polygons. In the example illustrated in FIG. 4, the first halo merely encompasses the sixth polygon 134 associated with the third mask or comprising a mask assignment to the third mask. Therefore, the sixth polygon 134 is in a set of polygons associated with the third mask and a polygon area is determined for the set of polygons corresponding to the third mask. In this example, the polygon area corresponding to the third mask is determined to comprise two units of area.

It will be appreciated that in some embodiments, one or more sets of polygons respectively associated with one or more different masks are encompassed within the first halo, as will be described in further detail in FIG. 6. Additionally, it will be appreciated that the first halo comprises an area where the polygon area is determined. For example, if a first portion of a polygon is encompassed by the first halo and a second portion of the polygon is not encompassed by the first halo, merely the first portion of the polygon encompassed by the first halo is used to determine the polygon area. In other words, portions of polygons not encompassed by the first halo are not considered for calculation of the polygon area, for example. In some embodiments, the first halo is shifted from a first location to a second location, as will be described in further detail in FIG. 6 or FIG. 9, for example.

Figure 5:
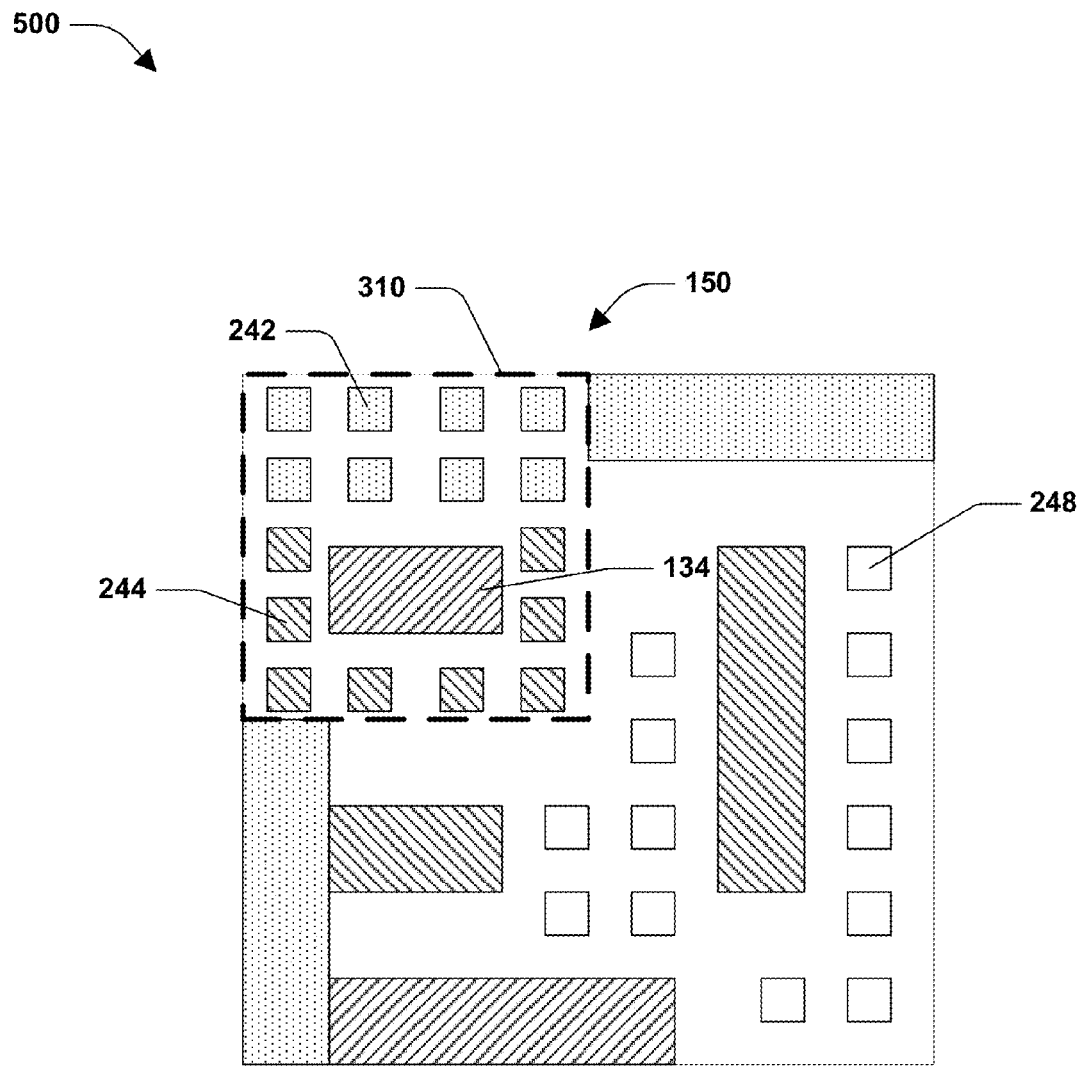
FIG. 5 is a top-down view of an example mask layout, according to some embodiments.

FIG. 5 is a top-down view 500 of an example mask layout, according to some embodiments. In some embodiments, a mask layout 150 of FIG. 5 is similar to the mask layout 150 of FIG. 4, except that one or more dummies within a first window 310 are assigned respective dummy mask assignments. For example, dummy 242 and dummy 244 comprise dummy mask assignments. The mask layout 150 comprises a sixth polygon 134 and one or more inserted dummies, such as dummy 242, dummy 244, and dummy 248. Additionally, the first window 310 surrounds, encompasses, or forms a perimeter around dummy 242 and dummy 244 at a first location. It will be appreciated that dummy 242 refers to any of the dummies encompassed within the first window 310 comprising a dotted fill pattern, such as the dotted fill pattern of dummy 242, and that not all of the dummies encompassed within the first window 310 comprising the dotted fill pattern of dummy 242 are labeled. Similarly, dummy 244 refers to any of the dummies encompassed within the first window 310 comprising a striped fill pattern, such as the striped fill pattern of dummy 244, and that not all of the dummies encompassed within the first window 310 comprising the striped fill pattern of dummy 244 are labeled. Similarly, dummy 248 refers to any of the dummies not encompassed by the first window 310, and that not all of the dummies not encompassed within the first window 310 are labeled. In some embodiments, the first halo is created or formed at the first location and overlaps the first window 310 such that the first halo and the first window 310 are indistinguishable. In some embodiments, the first halo is the first window 310.

In some embodiments, one or more polygon areas associated with one or more sets of polygons encompassed within the first halo are determined. In some embodiments, respective sets of polygons are associated with different masks. For example, the first halo encompasses one or more polygons. In FIG. 5, the first halo merely encompasses a sixth polygon 134. Additionally, the sixth polygon 134 comprises a mask assignment to a third mask. It will be appreciated that in other examples, the first halo encompasses multiple polygons. In some embodiments, a number of different mask assignments is determined for the one or more polygons encompassed within the first halo. Additionally, a number of sets of polygons encompassed within the first halo are formed based on the number of different mask assignments for the polygons encompassed within the halo. For example, if the first halo encompasses a first polygon comprising a mask assignment to a first mask, a second polygon comprising a mask assignment to a second mask, a third polygon comprising a mask assignment to a third mask, a fourth polygon comprising a mask assignment to the first mask, and a fifth polygon comprising a mask assignment to the second mask, the number of different mask assignments is three at least because the first halo encompasses polygons comprising mask assignments to at least one of the first mask, the second mask, and the third mask. Accordingly, three sets of polygons are formed. For example, a first set of polygons comprises the first polygon and the fourth polygon and the polygons of the first set of polygons are associated with a mask assignment to the first mask. Additionally, a second set of polygons comprises the second polygon and the fifth polygon and the polygons of the second set of polygons are associated with a mask assignment to the second mask. A third set of polygons comprises the third polygon associated with a mask assignment to the third mask. In this example, a first polygon area, a second polygon area, and a third polygon area are determined. According to some aspects, the first polygon area corresponds to the first mask, the second polygon area corresponds to the second mask, and the third polygon area corresponds to the third mask. For example, the first polygon area comprises an area equal to a sum of areas for respective polygons of the first set of polygons. In this example, the first polygon area is an area of the first polygon plus an area of the fourth polygon. Similarly, the second polygon area comprises an area equal to a sum of areas for respective polygons of the second set of polygons. In this example, the second polygon area is an area of the second polygon plus an area of the fifth polygon. The third polygon area comprises an area equal to a sum of areas for respective polygons of the third set of polygons. In this example, the third polygon area is an area of the third polygon.

In some embodiments, a polygon area is determined based on a polygon comprising a mask assignment to a mask, a halo at a location, and a halo size. For example, in FIG. 4, a polygon area such as a third polygon area is determined for a sixth polygon 134. The third polygon area of the sixth polygon 134 is determined based on the sixth polygon 134 comprising a mask assignment to a third mask. For example, the third polygon area is determined for all polygons comprising the mask assignment to the third mask encompassed within the first halo. Additionally, the third polygon area is determined based on a first halo at a first location, and a first halo size at least because the third polygon area is determined by analyzing polygons located within the first halo. It will be appreciated that if the first halo encompasses a first potion of a polygon and not a second portion of a polygon, merely the first portion of the polygon encompassed within the first halo is used to determine a polygon area associated with the polygon.

In some embodiments, one or more dummy mask assignments are assigned to one or more dummies encompassed within the first window 310. For example, the one or more dummy mask assignments are based on a polygon area, the first window, a location of the first window or the first window at a first location, and a first window size. As an example, if a first halo encompasses a first polygon area associated with a first mask comprising ten units of area, a second polygon area associated with a second mask comprising seven units of area, a third polygon area associated with a third mask comprising four units of area, and one or more dummies associated with a total dummy area of nine units of area, a first set of the one or more dummies is assigned a dummy mask assignment to the second mask and a second set of the one or more dummies is assigned a dummy mask assignment to the third mask. In some embodiments, the first set of the one or more dummies is associated with a dummy area of three units of area at least because the second polygon area comprises seven units of area such that the three units of area associated with the first set of the one or more dummies coupled with the second polygon area balances the second polygon area with the first polygon area at least because the area associated with the first set of the one or more dummies and the second polygon area is associated with the second mask and the area comprises a sum equal to ten units of area, such as the ten units of area of the first polygon area, thus balancing the loading of the mask with respect to the second polygon area and the first polygon area. In some embodiments, the second set of the one or more dummies is associated with a dummy area of six units of area at least because the third polygon area comprises four units of area such that the six units of area associated with the second set of the one or more dummies coupled with the third polygon area balances the third polygon area with the first polygon area at least because the area associated with the second set of the one or more dummies and the third polygon area is associated with the third mask and the area comprises a sum equal to ten units of area, such as the ten units of area of the first polygon area, thus balancing the loading of the mask with respect to the third polygon area and the first polygon area.

In some embodiments, the one or more dummy mask assignments are based on multiple polygon areas, such as a first polygon area, a second polygon area, a third polygon area, etc. In some embodiments, the one or more dummy mask assignments are based on a largest polygon area. Accordingly, one or more dummy mask assignments for the first set of the one or more dummies are based on the second polygon area and the first polygon area at least because the first polygon area is the largest polygon area and the first set of the one or more dummies compensates for a difference between the first polygon area and the second polygon area. Similarly, one or more dummy mask assignments for the second set of the one or more dummies are based on the third polygon area and the first polygon area at least because the first polygon area is a largest polygon area and the second set of the one or more dummies compensates for a difference between the first polygon area and the third polygon area.

In some embodiments, the one or more dummies encompassed within the first halo are associated with a total dummy area such that units of area associated with the one or more dummies is not sufficient to balance respective polygon areas. Accordingly, a dummy mask assignment is assigned to a dummy based on a total number of dummies or a total dummy area in such a scenario, for example. In some embodiments, if the total dummy area<a largest polygon area*(a number of sets of polygons−1)−a sum of non-largest polygon areas, load balancing for the mask layout 150 is adjusted. For example, if a first halo is associated with a first polygon area comprising ten units of area, a second polygon area comprising seven units of area, a third polygon area comprising four units of area, and one or more dummies encompassed within the first halo are associated with a total dummy area of three units of area, there is not sufficient total dummy area to balance the second polygon area and the third polygon area to ten units of area, respectively. In some embodiments, the one or more dummy mask assignments are based on a smallest polygon area. In some examples, the one or more dummies associated with the total dummy area of three units of area are assigned a dummy mask assignment to the third mask at least because the third polygon area is the smallest polygon area and the total dummy area is less than a largest polygon area—the smallest polygon area. Accordingly, the three units of area associated with the one or more dummies coupled with the third polygon area enables balancing between the third polygon area and the second polygon area such that the second polygon area and the third polygon area are both associated with seven units of area. For example, a loading of the mask is balanced with respect to the second polygon area and the third polygon area at least because the area associated with the one or more dummies and the third polygon area is associated with the third mask and the area comprises a sum equal to seven units of area, such as the seven units of area of the second polygon area.

In some embodiments, the one or more dummies encompassed within the first halo are associated with a total dummy area<a largest polygon area*(a number of sets of polygons−1)−a sum of non-largest polygon areas. For example, a first halo is associated with a first polygon area comprising ten units of area, a second polygon area comprising seven units of area, a third polygon area comprising four units of area, and four dummies encompassed within the first halo associated with a total dummy area of four units of area. For example, the first halo encompasses a first dummy comprising one unit of area, a second dummy comprising one unit of area, a third dummy comprising one unit of area, and a fourth dummy comprising one unit of area. In some embodiments, one or more dummy mask assignments are based on balancing multiple polygon areas, a largest polygon area, or a smallest polygon area. In some embodiments, the first dummy, the second dummy, and the third dummy are assigned dummy mask assignments to the third mask. For example, three of the four dummies are assigned a dummy mask assignment to the third mask at least because the third polygon area is the smallest polygon area and the three dummy mask assignments to the third mask coupled with the third polygon area balances the third polygon area and the second polygon area. For example, the three dummy mask assignments to the third mask balance the third polygon area with the second polygon area at least because the area associated with the three dummies comprising the third mask assignment and the third polygon area is associated with the third mask. Additionally, a sum of the area associated with the three dummies comprising the third mask assignment and the third polygon area is equal to seven units of area, such as the seven units of area of the second polygon area. Discounting the fourth dummy and the fourth dummy mask assignment for the fourth dummy, the first mask is associated with ten units of area, the second mask is associated with seven units of area, and the third mask is associated with seven units of area at least due to the three dummy mask assignments to the third mask. In some embodiments, the fourth dummy is assigned a dummy mask assignment to the second mask, and the second mask is associated with eight units of area at least due to the dummy mask assignment of the fourth dummy to the second mask. In other embodiments, the fourth dummy is assigned a dummy mask assignment to the third mask, and the third mask is associated with eight units of area at least due to the four dummy mask assignments to the third mask. For example, the fourth dummy is assigned a dummy mask assignment based on at least one of a random pattern or in an alternating sequence based on a lowest area associated with a mask, the lowest area calculated based on a sum of a polygon area associated with the mask and dummies comprising a dummy assignment to the mask.

It will be appreciated that FIG. 5 is an example of a balance last approach, at least because the one or more dummies are inserted in mask layout 150 prior to balancing mask loading, for example. In some embodiments, FIG. 5 is an example of a mask layout 150 after an iteration of a dummy mask assignment or balancing mask loading within a first window 310. In some embodiments, the mask layout 150 of FIG. 5 is received. For example, the mask layout 150 comprises the sixth polygon 134 and one or more other polygons. In some embodiments, the sixth polygon 134 comprises a mask assignment to a third mask, and other polygons of the mask layout 150 comprise a mask assignment to at least one of a first mask or a second mask. For example, the mask layout 150 is associated with the first mask, the second mask, and the third mask. Additionally, a first window 310 is created at a first location. In some embodiments, when the first window 310 is at the first location, the sixth polygon 134 is encompassed within the first window 310. Additionally, the first window 310 comprises a first window shape, a first window size, and a location, such as the first location. In some embodiments, the first window 310 is a first halo. In some examples, the third polygon area corresponds to the third mask.

In some embodiments, the third polygon area is determined based on the sixth polygon 134 comprising the mask assignment to the third mask, the first halo at the first location, and a first halo size. In other embodiments, the third polygon area is determined based on a set of polygons comprising a same mask assignment encompassed within the first halo. It will be appreciated that the set of polygons encompassed within the first halo vary based on a location of the first halo and the first halo size, for example. In FIG. 5, the sixth polygon 134 is encompassed within the first halo and is determined to comprise two units of area, for example. Accordingly, the third polygon area is determined to comprise two units of area at least because the set of polygons encompassed within the first halo merely comprises the sixth polygon 134.

In some embodiments, a dummy mask assignment is assigned to a dummy of one or more dummies in the mask layout 150 based on the third polygon area, the first window 310, a location of the first window, and the first window size. In other embodiments, the dummy mask assignment is determined based on an area associated with a mask or an area associated with a mask calculated within the first window 310. For example, the dummy mask assignment is determined based on balancing an area associated with a first mask with an area associated with a second mask. Accordingly, if an area associated with a first mask is greater than an area associated with a second mask, the dummy is assigned a dummy mask assignment to the second mask, and the area associated with the second mask increases at least due to an area of the dummy comprising the dummy mask assignment to the second mask. It will be appreciated that the dummy mask assignment will vary based on a location of the first window and the first window size, for example. In other embodiments, the dummy mask assignment varies based on the third polygon area or a polygon area. In FIG. 5, the third polygon area is two units of area, for example. In FIG. 5, the first window 310 encompasses sixteen dummies, and respective dummies comprise 0.25 units of area or a quarter of a unit of area. Therefore, an area associated with eight of the sixteen dummies is two units of area, similar to the two units of area of the third polygon area. Similarly, an area associated with the other eight dummies of the sixteen dummies is two units of area. Accordingly, eight of the sixteen dummies are assigned a dummy mask assignment to the first mask and the other eight of the sixteen dummies are assigned a dummy mask assignment to the second mask. Therefore, an area associated with the first mask is two units of area relative to the first window 310, at least because a sum of areas of polygons and dummies associated with the first mask is two units of area due to the eight dummies comprising the dummy mask assignment to the first mask. Similarly, an area associated with the second mask is two units of area relative to the first window 310, at least because a sum of areas of polygons and dummies associated with the second mask is two units of area due to the other eight dummies comprising the dummy mask assignment to the second mask.

In some embodiments, dummy 242 is assigned to the second mask and dummy 244 is assigned to the first mask. It will be appreciated that dummy 242 refers to any of the dummies comprising the dummy mask assignment to the second mask, and that not all of the dummies comprising the dummy mask assignment to the second mask are labeled. For example, the dummies comprising a dotted fill pattern comprise the dummy assignment to the second mask. Similarly, dummy 244 refers to any of the dummies comprising the dummy mask assignment to the first mask, and that not all of the dummies comprising the dummy mask assignment to the first are labeled. For example, the dummies comprising a striped fill pattern, such as the striped fill pattern of dummy 244, comprise the dummy assignment to the first mask.

Figure 6:
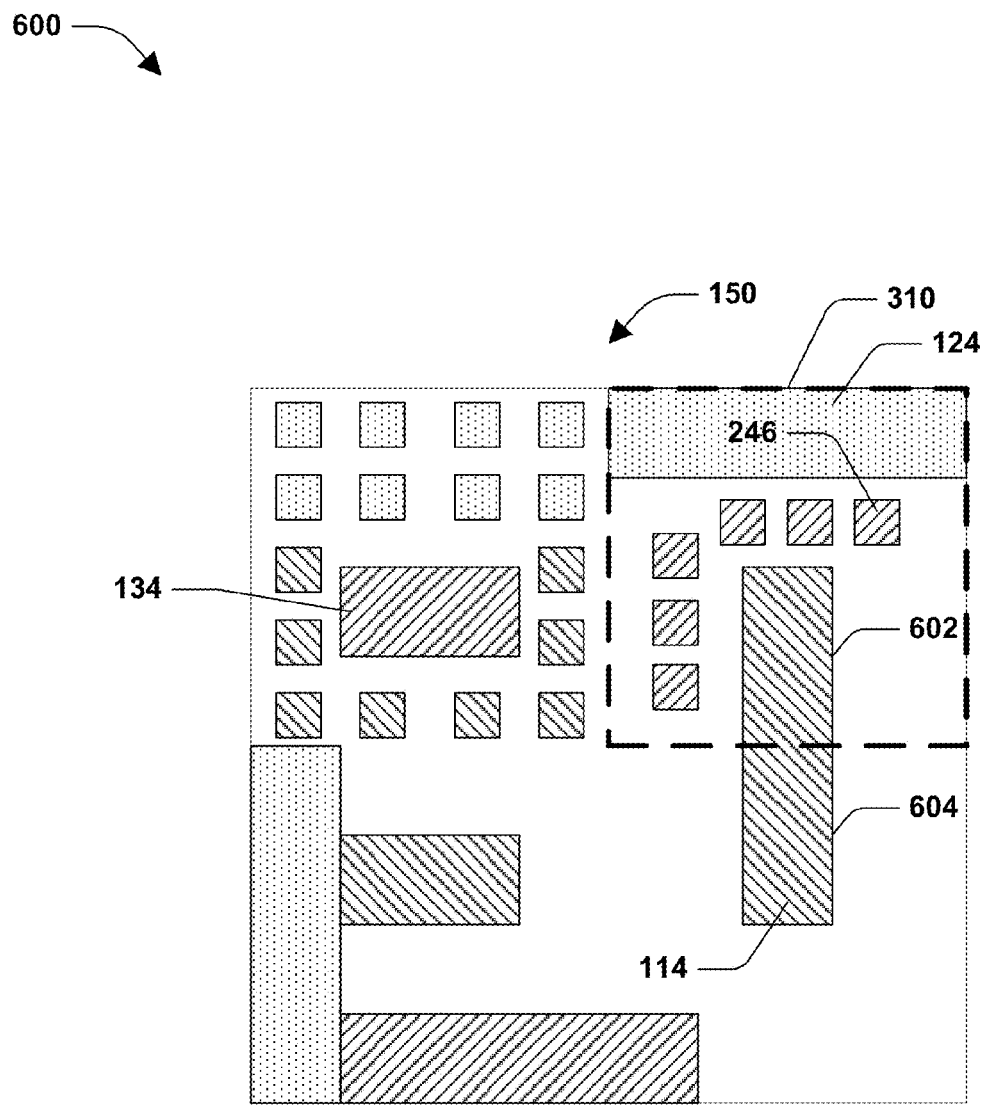
FIG. 6 is a top-down view of an example mask layout, according to some embodiments.

FIG. 6 is a top-down view 600 of an example mask layout, according to some embodiments. It will be appreciated that FIG. 6 is an example of a balance first approach, at least because one or more dummies are inserted in mask layout 150 based on a first window 310 and a first halo identical to the first window 310, for example. In some embodiments, a mask layout 150 of FIG. 6 is similar to the mask layout 150 of FIG. 3, except that the first window 310 is shifted to a second location, rather than being positioned at the first location illustrated in FIG. 3. In this example, the first window 310 is a first halo. The mask layout 150 comprises a fourth polygon 124, a second polygon 114, and a sixth polygon 134. In some embodiments, the first window 310 encompasses the fourth polygon 124 and a first portion of the second polygon 602 when the first window 310 is at the second location. Additionally, a second portion of the second polygon 602 is not encompassed by the first window 310. In some examples, the second polygon 114 comprises a mask assignment to a first mask, the fourth polygon 124 comprises a mask assignment to a second mask, and the sixth polygon 134 comprises a mask assignment to a third mask. Accordingly, the mask layout 150 is associated with a first mask, a second mask, and a third mask. Therefore, the mask layout 150 is associated with three different mask assignments.

In some embodiments, a first polygon area, a second polygon area, and a third polygon area are determined based on a first set of polygons encompassed within the first halo, a second set of polygons encompassed within the first halo, and a third set of polygons encompassed within the first halo. For example, the first set of polygons comprises polygons encompassed within the first halo comprising a mask assignment to the first mask. For example, the second set of polygons comprises polygons encompassed within the first halo comprising a mask assignment to the second mask. For example, the third set of polygons comprises polygons encompassed within the first halo comprising a mask assignment to the third mask. In FIG. 6, the first halo is at a second location and encompasses the fourth polygon 124 and the second polygon 114. Therefore, the first halo does not encompass a polygon comprising a mask assignment to the third mask.

In some embodiments, a first polygon area and a second polygon area are determined based on the second polygon 114 and the fourth polygon 124, respectively. For example, the first polygon area corresponds to the first mask at least because the second polygon 114 comprises the mask assignment to the first mask. Similarly, the second polygon area corresponds to the second mask at least because the fourth polygon 124 comprises the mask assignment to the second mask. For example, the first polygon area is an area associated with the first mask with respect to polygons encompassed within the first halo. Similarly, the second polygon area is an area associated with the second mask with respect to polygons encompassed within the first halo. As an example, the second polygon area is determined to comprise six units of area at least because the fourth polygon comprises six units of area. In some embodiments, the second polygon 114 comprises twelve units of area. However, it will be appreciated that the first portion of the second polygon 602 encompassed within the first halo comprises six units of area. Accordingly, the first polygon area is determined to comprise six units of area at least because the portion of the second polygon 114 encompassed within the first halo, such as the first portion of the second polygon 602, comprises six units of area.

In some embodiments, a dummy mask assignment is assigned to a dummy of one or more dummies based on the first polygon area, the second polygon area, the first window 310, a location of the first window, and the first window size. In FIG. 6, the first polygon area comprises six units of area and the second polygon area comprises six units of area. The third polygon area comprises zero units of area at least because the first halo does not encompass any polygons associated with a third mask. In some embodiments, six dummies are inserted in the first window 310. For example, a dummy of the six dummies comprises one unit of area and together, the six dummies comprise six units of area. In some embodiments, the dummy mask assignment is based on the first window 310 at least because merely dummies encompassed by the first window 310 are assigned a dummy mask assignment in some embodiments. It will be appreciated that the dummy mask assignment will vary based on the location of the first window and the first window size, for example. When the first window is at a first location, such as the first window 310 of FIG. 3, the first window 310 encompasses a sixth polygon 134. In some embodiments, the first window is shifted from the first location to a second location, such as the second location of the first window 310 in FIG. 6. Accordingly, the first window 310 encompasses the fourth polygon 124 and the first portion of the second polygon 602 when shifted to the second location, for example. In other embodiments, the first window 310 is shifted to a third location different than the first location and the second location.

Accordingly, the six dummies are assigned a dummy mask assignment to the third mask at least because the first polygon area represents six units of area for the first mask, the second polygon area represents six units of area for the second mask, and the dummy mask assignments create six units of area for the third mask within the first window 310 or the first halo. In some embodiments, dummy 246 is assigned a dummy mask assignment to the third mask. It will be appreciated that dummy 246 refers to any of the dummies comprising the dummy mask assignment to the third mask, and that not all of the dummies comprising the dummy mask assignment to the third mask are labeled. For example, the dummies comprising a striped fill pattern comprise the dummy assignment to the third mask.

Figure 7:
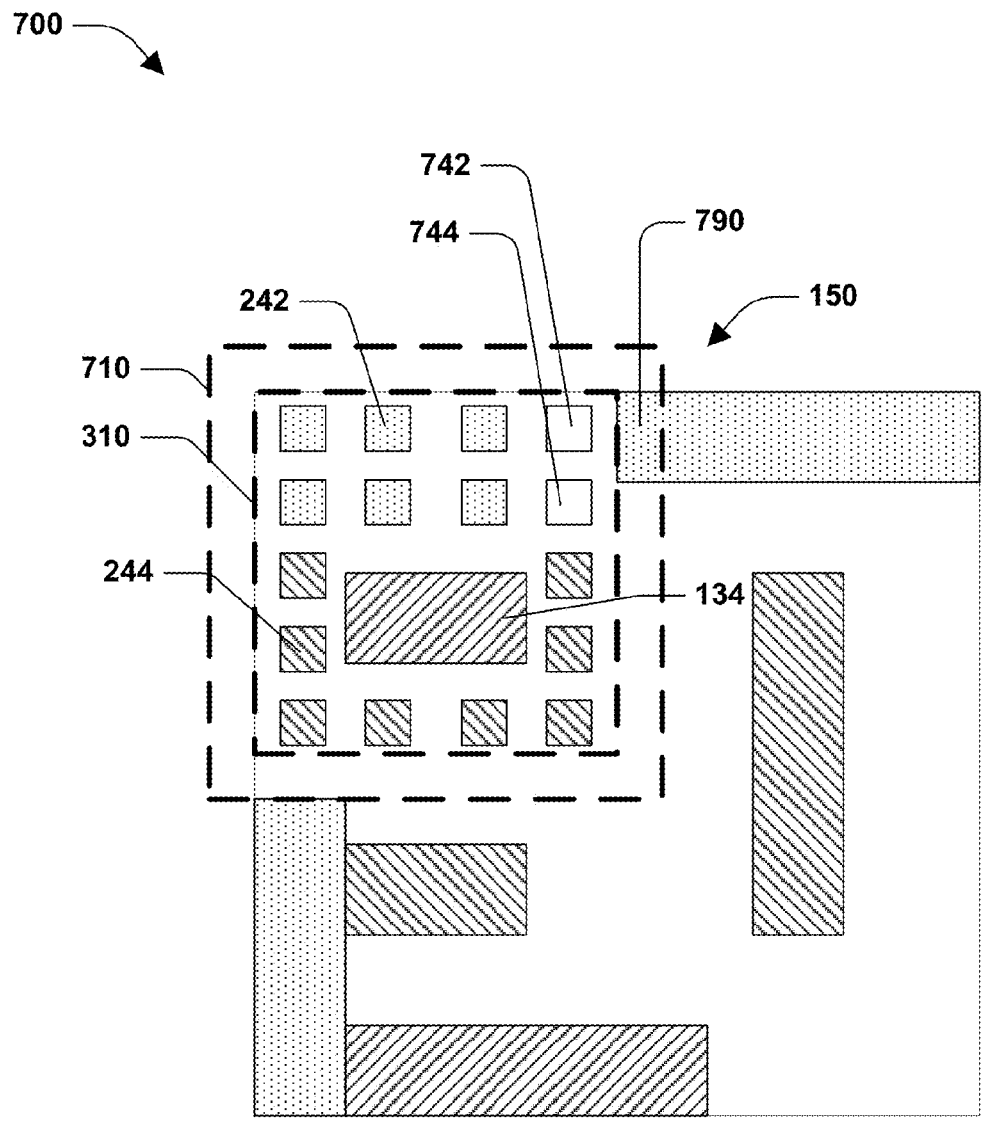
FIG. 7 is a top-down view of an example mask layout, according to some embodiments.

FIG. 7 is a top-down view 700 of an example mask layout, according to some embodiments. It will be appreciated that FIG. 7 is an example of a balance first approach. In some embodiments, a mask layout 150 of FIG. 7 is similar to the mask layout 150 of FIG. 3, except that a first halo 710 comprises a first halo size different than a first window size of a first window 310. In some embodiments, a polygon area is determined based on the first halo size of the first halo 710. The mask layout 150 comprises a sixth polygon 134. In some embodiments, the first halo 710 encompasses a portion of a fourth polygon 790 and the sixth polygon 134. In some embodiments, the first window 310 encompasses the sixth polygon 134. For example, one or more dummies are inserted within the first window 310 and assigned respective dummy mask assignments. In FIG. 7, sixteen dummies are inserted within the first window 310. Respective dummies of the sixteen dummies comprise one unit of area, and thus, the sixteen dummies comprise sixteen units of area, collectively. The fourth polygon comprises a mask assignment to a second mask and the sixth polygon 134 comprises a mask assignment to a third mask. Accordingly, the portion of the fourth polygon 790 comprises the mask assignment to the second mask.

In some embodiments, a second polygon area and a third polygon area are determined based on a second set of polygons encompassed within the first halo 710, and a third set of polygons encompassed within the first halo 710. For example, the second set of polygons comprises polygons encompassed within the first halo 710 comprising a mask assignment to the second mask, such as the portion of the fourth polygon 790. For example, the third set of polygons comprises polygons encompassed within the first halo 710 comprising a mask assignment to the third mask, such as the sixth polygon 134. Accordingly, the second polygon area and the third polygon area are determined based on the portion of the fourth polygon 790 and the sixth polygon 134, respectively. For example, the second polygon area is two units of area and the third polygon area is eight units of area.

In some embodiments, eight dummies are assigned a dummy mask assignment to the first mask, six dummies are assigned a dummy mask assignment to the second mask, and the other two dummies 742 and 744 are assigned a random dummy mask assignment. It will be appreciated that dummy 242 refers to any of the dummies comprising the dummy mask assignment to the second mask, and that not all of the dummies comprising the dummy mask assignment to the second mask are labeled. For example, the dummies comprising a dotted fill pattern comprise the dummy assignment to the second mask. It will be appreciated that dummy 244 refers to any of the dummies comprising the dummy mask assignment to the first mask, and that not all of the dummies comprising the dummy mask assignment to the first mask are labeled. For example, the dummies comprising a striped fill pattern, such as the striped fill pattern of dummy 244, comprise the dummy assignment to the first mask.

Figure 8:
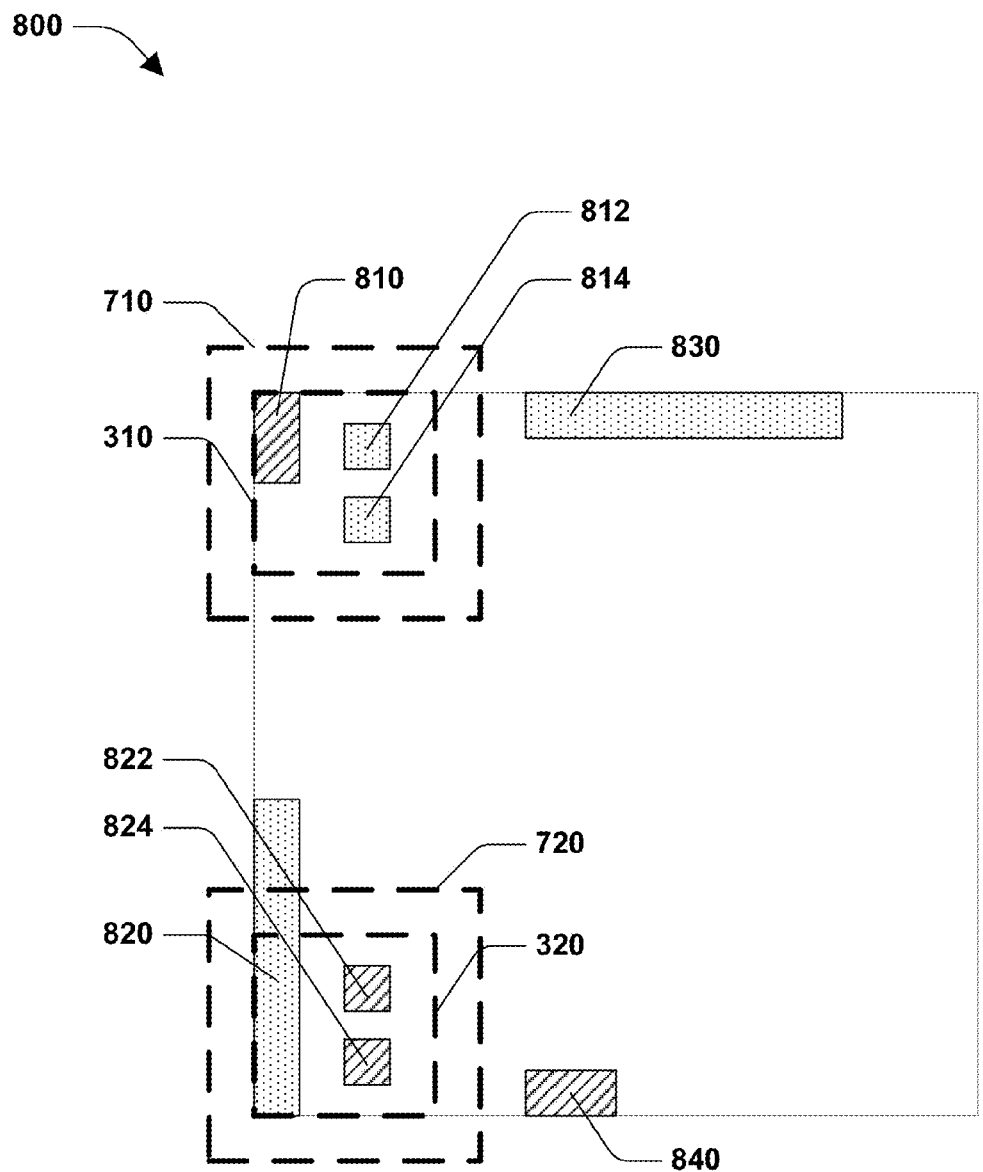
FIG. 8 is a top-down view of an example mask layout, according to some embodiments.
Figure 9:
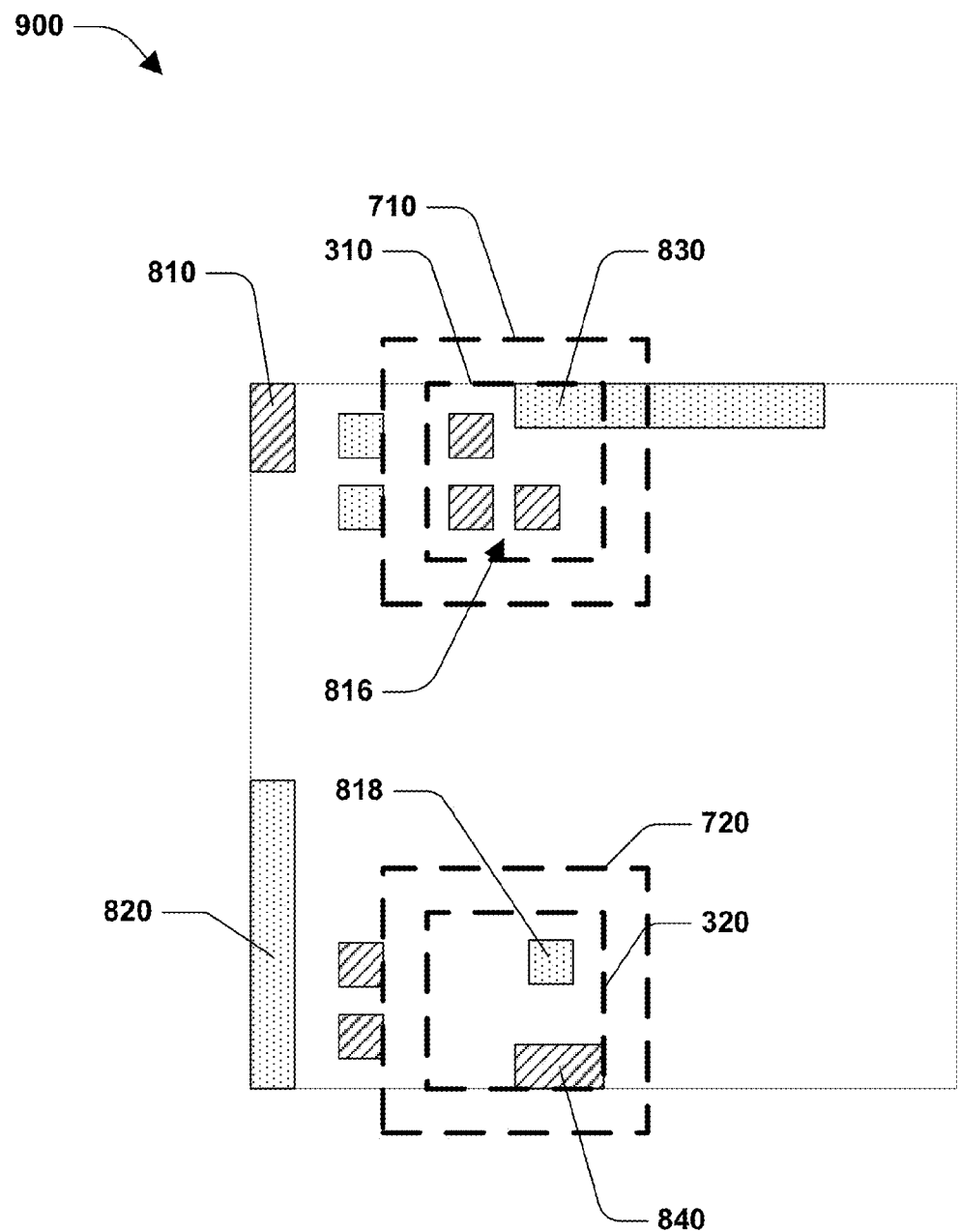
FIG. 9 is a top-down view of an example mask layout, according to some embodiments.

FIG. 8 is a top-down view 800 of an example mask layout, according to some embodiments. Similarly, FIG. 9 is a top-down view 900 of an example mask layout, according to some embodiments, and will be described in conjunction with FIG.

8. The mask layouts of FIG. 8 and FIG. 9 comprise a first polygon 810 associated with a first mask, a second polygon 820 associated with a second mask, a third polygon 830 associated with the second mask, and a fourth polygon 840 associated with the first mask, for example. It will be appreciated that the dummies of FIG. 8 and FIG. 9 comprise one unit of area.

In FIG. 8, a first window 310 and a first halo 710 are at a first location and encompass the first polygon 810. Additionally, in FIG. 8, a second window 320 and a second halo 720 are at a second location and encompass the second polygon 820. In some embodiments, a polygon area is an area associated with a set of one or more polygons sharing a mask assignment, the set of polygons encompassed within a halo at a location. It will be appreciated that in some embodiments, the first halo 710 and the second halo 720 are at least one of the same size or the same perimeter as at least one of the first window 310 or the second window 320, respectively. Accordingly, in these embodiments, merely at least one of the first window 310 or the second window 320 are used. For example, the first halo 710 and the second halo 720 are at least one of removed from FIG. 8 or overlapping at least one of the first window 310 or the second window 320, respectively.

For example, a first polygon area is associated with a first mask and a second polygon area is associated with a second mask. Accordingly, a first polygon area is determined for the first halo 710 at the first location and a second polygon area is determined for the first halo 710 at the first location. For example, the first polygon area for the first halo 710 at the first location is two units of area and the second polygon area for the first halo 710 at the first location is zero units of area.

Similarly, a first polygon area is determined for the second halo 720 at the second location and a second polygon area is determined for the second halo 720 at the second location. For example, the first polygon area for the second halo 720 at the second location is zero units of area and the second polygon area for the second halo 720 at the second location is two units of area.

In some embodiments, a first dummy 812 and a second dummy 814 are inserted within the first window 310. Additionally, the first dummy 812 is assigned a first dummy mask assignment to the second mask and the second dummy 814 is assigned a second dummy mask assignment to the second mask at least because the first polygon area for the first halo 710 at the first location is two units of area and is associated with the first mask. Therefore, the first dummy mask assignment and the second dummy mask assignment adjust the second polygon area for the first halo 710 at the first location to be two units of area, at least due to the two units of area of the first dummy 812 and the second dummy 814 associated with the second mask via respective dummy mask assignments, for example.

In some embodiments, a third dummy 822 and a fourth dummy 824 are inserted within the second window 320. Additionally, the third dummy 822 is assigned a third dummy mask assignment to the first mask and the fourth dummy 824 is assigned a fourth dummy mask assignment to the first mask at least because the second polygon area for the second halo 720 at the second location is two units of area and is associated with the second mask. Therefore, the third dummy mask assignment and the fourth dummy mask assignment adjust the first polygon area for the second halo 720 at the second location to be two units of area, at least due to the two units of area of the third dummy 822 and the fourth dummy 824 associated with the first mask via respective dummy mask assignments, for example.

In FIG. 9, the first window 310 and the first halo 710 are shifted to a third location and encompass the third polygon 830. Additionally, in FIG. 9, the second window 320 and the second halo 720 are shifted to a fourth location and encompass the fourth polygon 840.

For example, a first polygon area is determined for the first halo 710 at the third location and a second polygon area is determined for the first halo 710 at the third location. For example, the first polygon area for the first halo 710 at the third location is zero units of area and the second polygon area for the first halo 710 at the third location is three units of area. It will be appreciated that the first halo 710 at the first location encompasses a larger area than the first window 310 at the first location at least because a first halo size of the first halo 710 is larger than a first window size of the first window 310.

Similarly, a first polygon area is determined for the second halo 720 at the fourth location and a second polygon area is determined for the second halo 720 at the fourth location. For example, the first polygon area for the second halo 720 at the fourth location is one unit of area and the second polygon area for the second halo 720 at the fourth location is zero units of area.

In some embodiments, a set of dummies 816 is inserted within the first window 310. For example, the set of dummies 816 comprises three dummies. Additionally, the three dummies of the set of dummies 816 are assigned a dummy mask assignment to the first mask at least because the second polygon area for the first halo 710 at the third location is three units of area and is associated with the second mask. Therefore, the dummy mask assignment for the set of dummies 816 adjust the first polygon area for the first halo 710 at the third location to be three units of area, at least due to the three units of area associated with the set of dummies 816 and the set of dummies 816 associated with the first mask via respective dummy mask assignments, for example.

In some embodiments, a dummy 818 is inserted within the second window 320. Additionally, the dummy 818 is assigned a dummy mask assignment to the second mask at least because the first polygon area for the second halo 720 at the fourth location is one unit of area and is associated with the first mask. Therefore, the dummy mask assignment adjusts the second polygon area for the second halo 720 at the fourth location to be one unit of area, at least due to the one unit of area of the dummy 818 associated with the second mask via the dummy mask assignment, for example.

Figure 10:
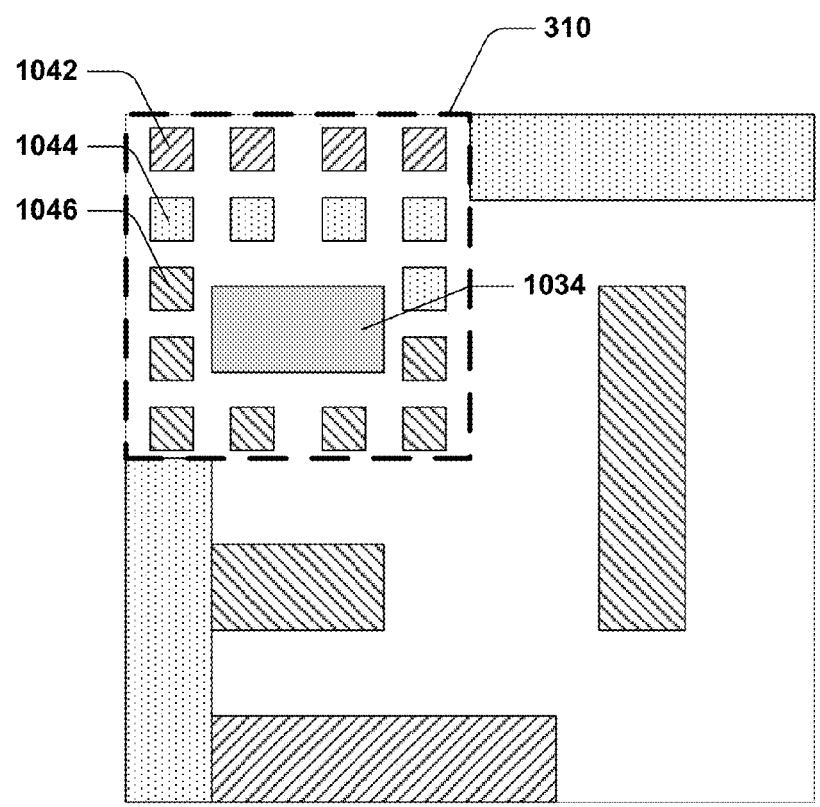
FIG. 10 is a top-down view of an example mask layout, according to some embodiments.

FIG. 10 is a top-down view 1000 of an example mask layout, according to some embodiments. In some embodiments, a first window 310 encompasses a first polygon 1034. It will be appreciated that in some scenarios, such as a partial mask assignment, the first polygon 1034 comprises an undetermined assignment or no mask assignment, for example. In some embodiments, one or more dummies within the first window 310 are randomly assigned a dummy mask assignment to a mask of one or more masks associated with the mask layout. In some embodiments, one or more dummies within the first window 310 are assigned a dummy mask assignment to a mask of one or more masks associated with the mask layout in a rotating fashion. For example, if the mask layout is associated with a first mask, a second mask, and a third mask, a first dummy 1042 is assigned a dummy mask assignment to a first mask, a second dummy 1044 is assigned a dummy mask assignment to a second mask, and a third dummy 1046 is assigned a dummy mask assignment to a third mask, etc.

Figure 11:
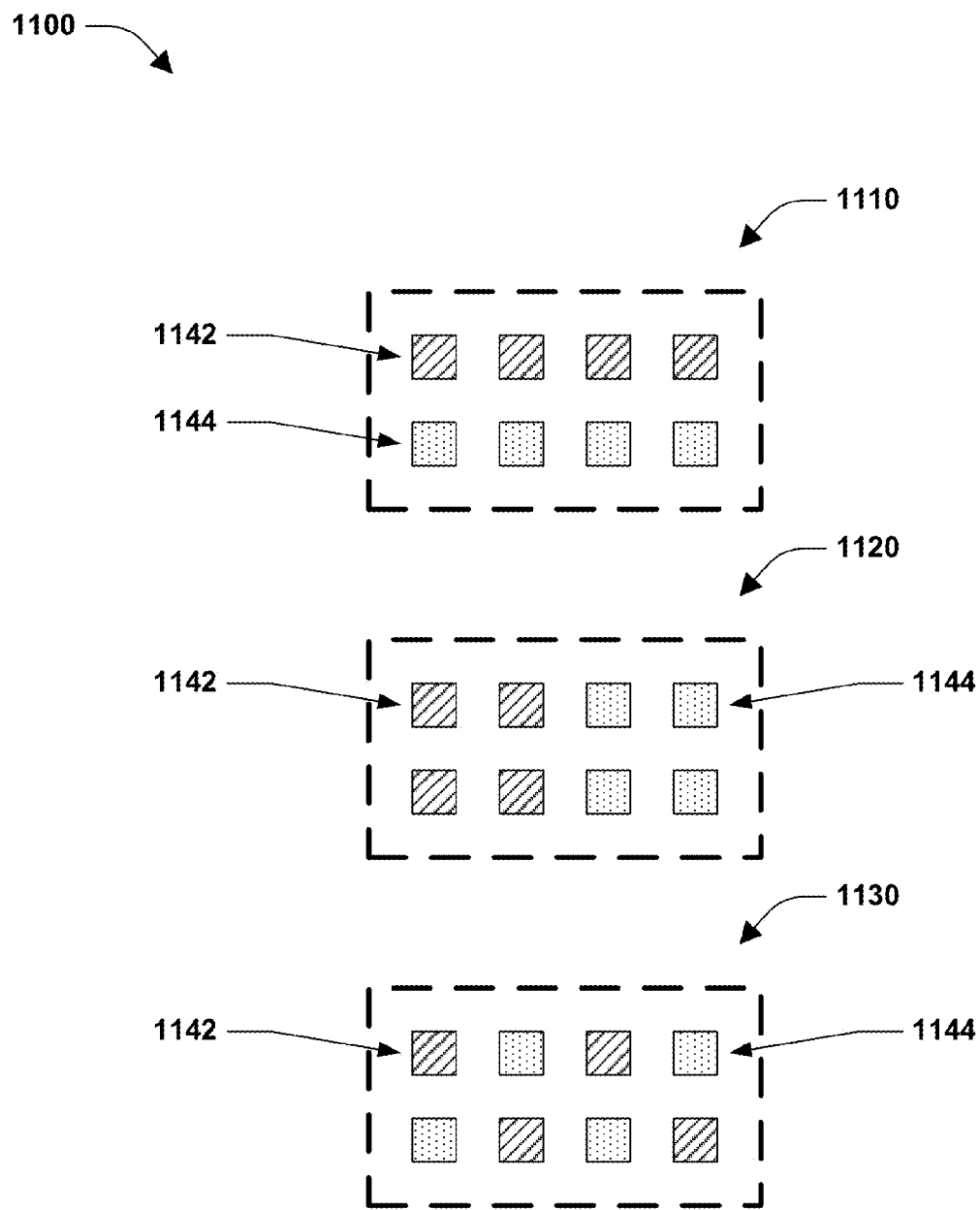
FIG. 11 is a top-down view of an example dummy layout, according to some embodiments.

FIG. 11 is a top-down view 1100 of an example dummy layout, according to some embodiments. For example, at 1110, a first pattern comprises a first row of dummies 1142 comprising dummy mask assignments to a first mask and a second row of dummies 1144 comprising dummy mask assignments to a second mask. For example, at 1120, a second pattern comprises a first block of dummies 1142 comprising dummy mask assignments to the first mask and a second block of dummies 1144 comprising dummy mask assignments to the second mask. In some embodiments, the second pattern 1120 comprises a first column of dummies 1142 and a second column of dummies 1144. For example, at 1130, a third pattern comprises a first checkerboard pattern of dummies 1142 comprising dummy mask assignments to the first mask and a corresponding second checkerboard pattern of dummies 1144 comprising dummy mask assignments to the second mask. In other embodiments, dummy mask assignments are assigned to dummies at least one of row by row, column by column, by a vertical cluster, by a horizontal cluster, or based on a polygon of the mask layout. For example, when the polygon of the mask layout is arranged such that a first row of dummies is closer to the polygon and a second row of dummies is farther than the first row of dummies, the second row of dummies are assigned a dummy mask assignment to a same mask as a mask assignment of the polygon at least because the second row is farther away than the first row. In other words, the dummy mask assignment is based on a distance of a dummy from a polygon.

Figure 12:
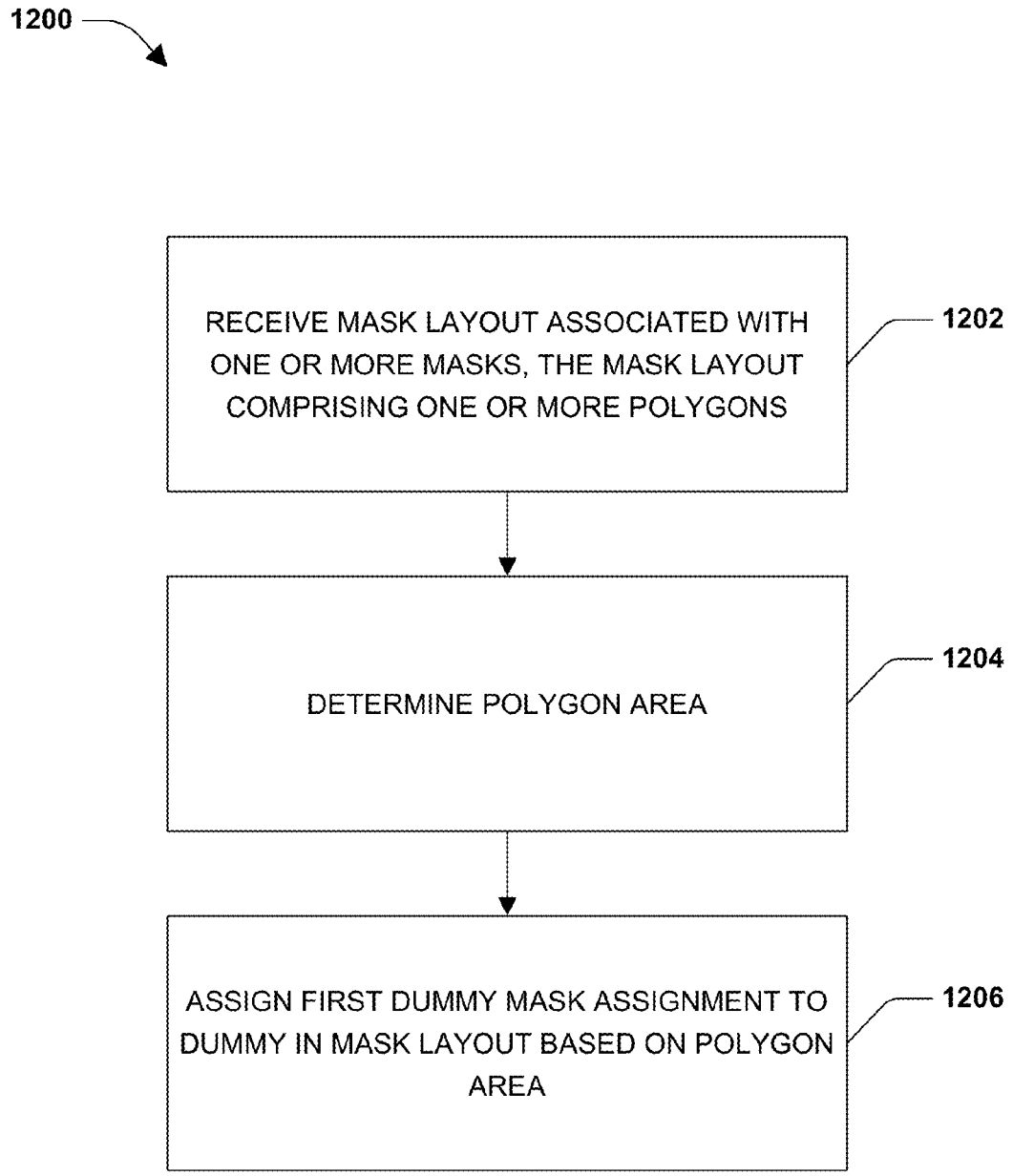
FIG. 12 is a flow diagram of an example method for balancing mask loading, according to some embodiments.

FIG. 12 is a flow diagram of an example method 1200 for balancing mask loading, according to some embodiments. At 1202, the method comprises receiving a mask layout associated with one or more masks, the mask layout comprising one or more polygons, a first polygon of the one or more polygons comprising a mask assignment to a first mask of the one or more masks. At 1204, the method comprises determining a first polygon area corresponding to the first mask based on the first polygon comprising the mask assignment to the first mask. At 1206, the method comprises assigning a first dummy mask assignment to a first dummy of one or more dummies in the mask layout based on the first polygon area, the first dummy mask assignment comprising at least one of an assignment to at least one of the one or more masks or an undetermined assignment, thus balancing mask loading within the semiconductor processing environment. In some embodiments, the method comprises creating a first window comprising a first window size less than a mask size of the mask layout, the first window at a first location in the mask layout. Additionally, a first halo is created, and comprises a first halo size of at least the first window size, the first halo at the first location in the mask layout. According to some aspects, the first polygon area is determined based on the first halo at the first location. Similarly, the first dummy mask assignment is determined based on the first window at the first location. In some embodiments, the first window is shifted from the first location to a second location. In some embodiments, the first halo is shifted from the first location to a second location. Accordingly, the first polygon area is determined based on the first halo at the second location when the first halo is shifted to the second location, for example. In some embodiments, the method comprises inserting at least some of the one or more dummies in the mask layout, such as prior to assigning a dummy mask assignment to a dummy. In some examples, shifting the first window or the first halo is based on a shift pattern or a random shift pattern.

Figure 13:
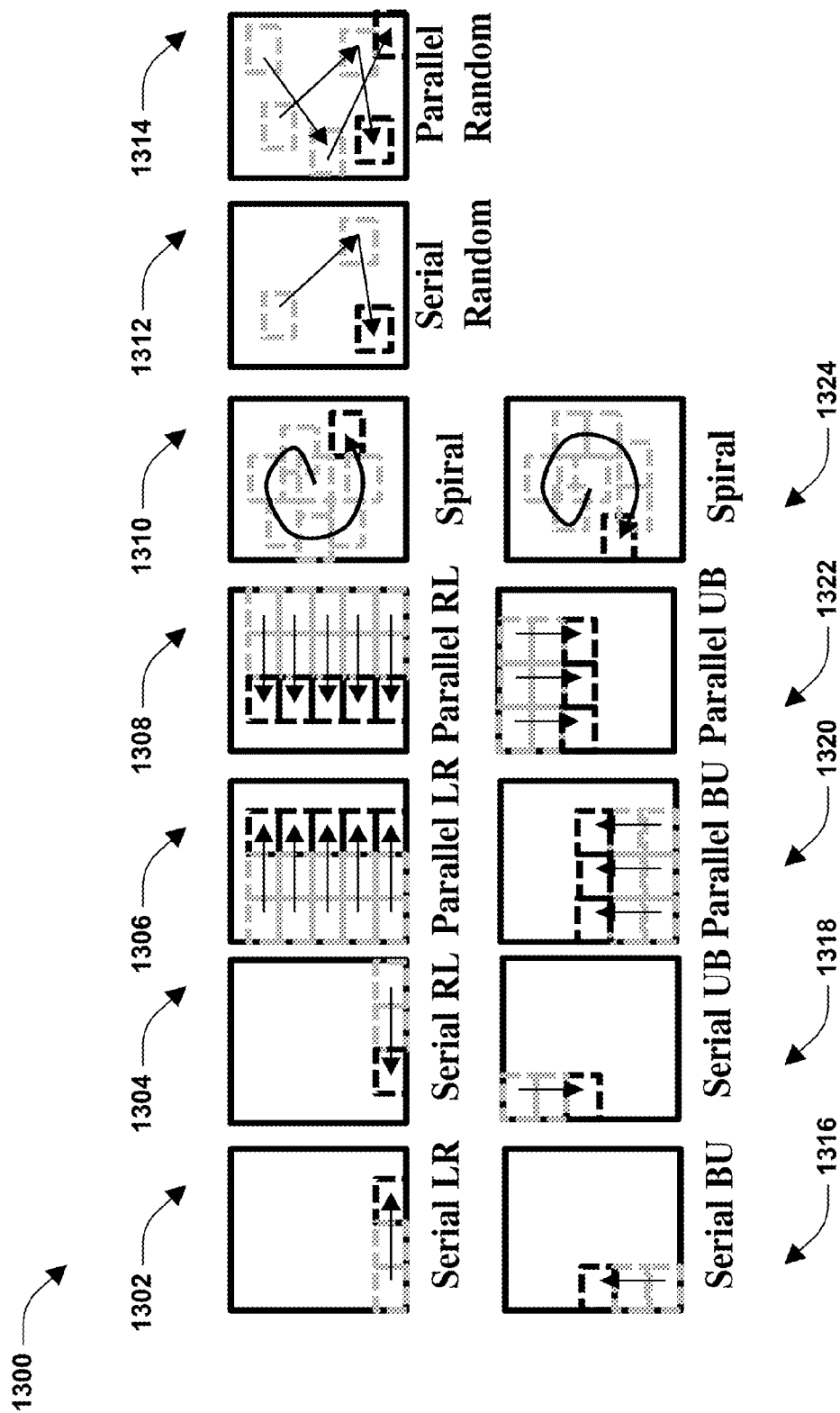
FIG. 13 is a diagram of example shift patterns, according to some embodiments.

FIG. 13 is a diagram of example shift patterns, according to some embodiments. It will be appreciated that a shift pattern is a shift pattern for at least one of a window or a halo. Additionally, the following examples are discussed in terms of shifting windows. However, shifting halos are contemplated in a similar manner. For example, at 1302, a window is shifted in a serial LR manner or from left to right serially. For example, at 1304, a window is shifted in a serial RL manner or from right to left serially. For example, at 1306, one or more windows are shifted in a parallel LR manner such that respective windows are shifted from left to right concurrently. For example, at 1308, one or more windows are shifted in a parallel RL manner such that respective windows are shifted from right to left concurrently. At 1310, a window is shifted in a counterclockwise pattern. At 1324, a window is shifted in a clockwise pattern. It will be appreciated that during shifting, a window may overlap a location previously covered in the shift pattern. At 1312, a window is shifted randomly. At 1314, one or more windows are shifted randomly in a concurrent fashion. In some embodiments, a window is shifted in a serial BU 1316 or a serial UB fashion 1318. For example, a window is shifted from the bottom to the top or bottom up at 1316. For example, a window is shifted from the top to the bottom or up bottom at 1318. Similarly, one or more windows are shifted in a parallel BU 1320 or a parallel UB fashion 1322. For example, one or more respective windows are shifted from the bottom to the top or bottom up in a concurrent fashion at 1316. For example, one or more respective windows are shifted from the top to the bottom or up bottom in a concurrent fashion at 1318.

Figure 14:
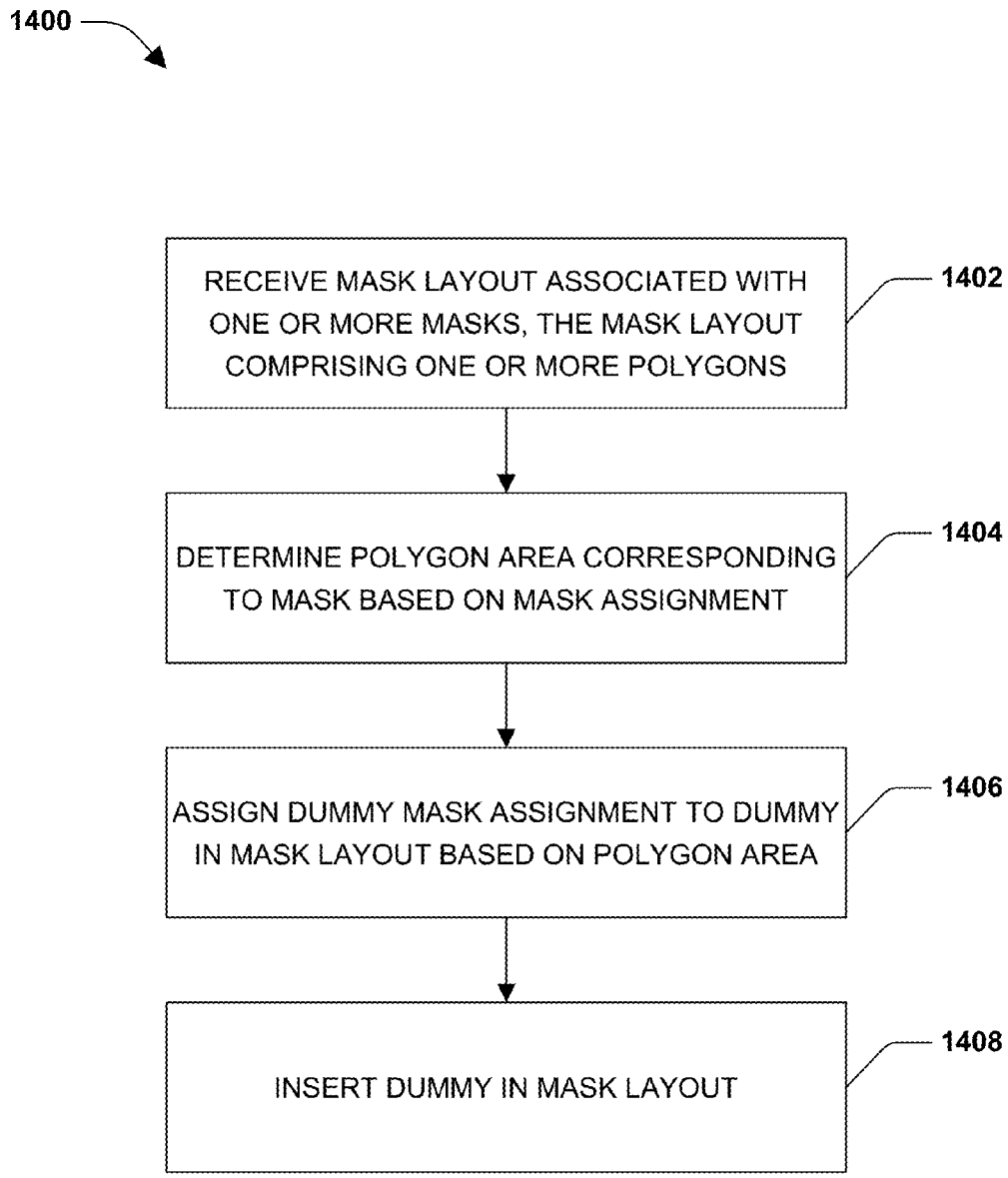
FIG. 14 is a flow diagram of an example method for balancing mask loading, according to some embodiments.

FIG. 14 is a flow diagram of an example method 1400 for balancing mask loading, according to some embodiments. For example, at 1402, the method comprises receiving a mask layout associated with one or more masks, the mask layout comprising one or more polygons, a first polygon of the one or more polygons comprising a mask assignment to a first mask of the one or more masks. At 1404, the method comprises determining a first polygon area corresponding to the first mask based on the first polygon comprising the mask assignment to the first mask. Additionally, at 1406, a first dummy mask assignment is assigned to a first dummy of one or more dummies in the mask layout based on the first polygon area, the first dummy mask assignment comprising at least one of an assignment to at least one of the one or more masks or an undetermined assignment. At 1408, at least some of the one or more dummies are inserted in the mask layout, thus balancing mask loading within the semiconductor processing environment.

Figure 15:
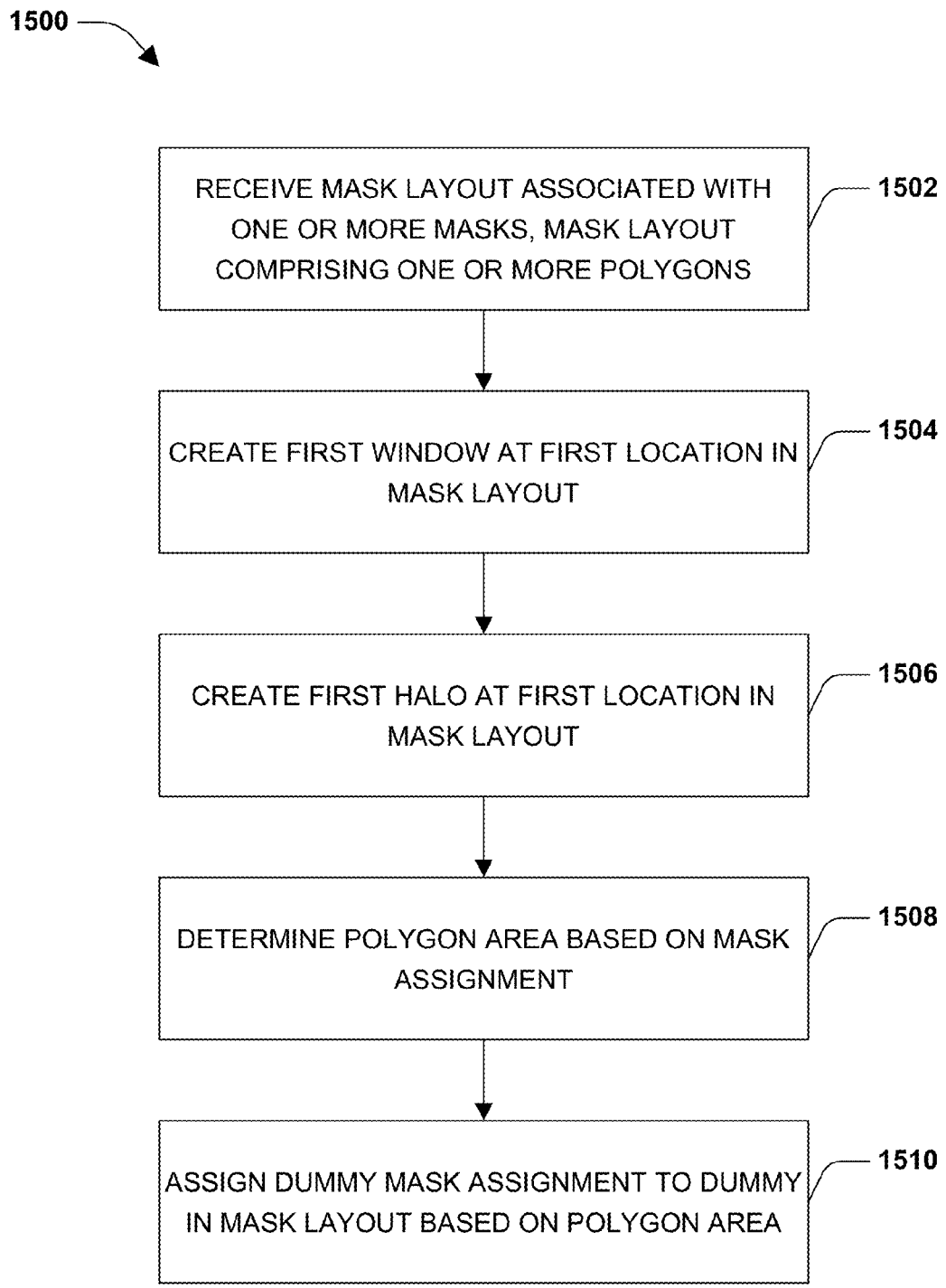
FIG. 15 is a flow diagram of an example method for balancing mask loading, according to some embodiments.

FIG. 15 is a flow diagram of an example method 1500 for balancing mask loading, according to some embodiments. For example, at 1502, a mask layout associated with one or more masks is received, the mask layout comprising one or more polygons, a first polygon of the one or more polygons comprising a first mask assignment to a first mask of the one or more masks. At 1504, a first window comprising a first window size less than a mask size of the mask layout is created, the first window at a first location in the mask layout. At 1506, a first halo comprising a first halo size of at least the first window size is created, the first halo at the first location in the mask layout, the first halo encompassing at least a portion of the first polygon when the first halo is at the first location. At 1508, a first polygon area corresponding to the first mask is determined based on the first polygon comprising the first mask assignment to the first mask, the first halo at the first location, and the first halo size. At 1510, a first dummy mask assignment is assigned to a first dummy of one or more dummies in the mask layout based on the first polygon area, the first window at the first location, and the first window size, the first dummy mask assignment comprising at least one of an assignment to at least one of the one or more masks or an undetermined assignment, thus balancing mask loading within the semiconductor processing environment.

In other embodiments, the method 1500 comprises creating a second window comprising a second window size less than the mask size of the mask layout, the second window at a second location in the mask layout, a second polygon of the one or more polygons comprising a second mask assignment to the first mask of the one or more masks. Additionally, the method comprises creating a second halo comprising a second halo size of at least the second window size, the second halo at the second location in the mask layout, the second halo encompassing at least a portion of the second polygon when the second halo is at the second location. In some embodiments, the method comprises determining a second polygon area corresponding to the first mask based on the second polygon comprising the second mask assignment to the first mask, the second halo at the second location, and the second halo size. According to some aspects, the method comprises assigning a second dummy mask assignment to a second dummy of the one or more dummies in the mask layout based on the second polygon area, the second window at the second location, and the second window size, the second dummy mask assignment comprising at least one of the one or more masks or the undetermined assignment.

In some embodiments, a first window and a second window are shifted in parallel. For example, a method comprises shifting at least one of the first window or the first halo to a third location and shifting at least one of the second window or the second halo to a fourth location. Accordingly, polygon areas for respective windows are determined in parallel. For example, a third polygon area corresponding to the first mask is determined based on a third polygon of the one or more polygons comprising a third mask assignment to the first mask, the first halo encompassing at least a portion of the third polygon when the first halo is at the third location, and the first halo size. Similarly, a fourth polygon area corresponding to the first mask is determined based on a fourth polygon of the one or more polygons comprising a fourth mask assignment to the first mask, the second halo encompassing at least a portion of the fourth polygon when the second halo is at the fourth location, and the second halo size. In some embodiments, dummy mask assignments for one or more dummies of respective windows are assigned in parallel. For example, a third dummy mask assignment is assigned to a third dummy of the one or more dummies in the mask layout based on the third polygon area, the first window at the third location, and the first window size, the third dummy mask assignment comprising at least one of an assignment to at least one of the one or more masks or the undetermined assignment. Similarly, a fourth dummy mask assignment is assigned to a fourth dummy of the one or more dummies in the mask layout based on the fourth polygon area, the second window at the fourth location, and the second window size, the fourth dummy mask assignment comprising at least one of an assignment to at least one of the one or more masks or the undetermined assignment. In some embodiments, an additional polygon area is determined for an additional mask at least because a halo encompasses one or more polygons associated with a first mask and one or more polygons associated with an additional mask, such as a second mask. For example, a corresponding method comprises determining a fifth polygon area corresponding to a second mask of the one or more masks based on a fifth polygon of the one or more polygons comprising a fifth mask assignment to the second mask of the one or more masks, the first halo encompassing at least a portion of the fifth polygon when the first halo is at the first location, and the first halo size. Additionally, the method comprises assigning a fifth dummy mask assignment to a fifth dummy of the one or more dummies in the mask layout based on the fifth polygon area, the first window at the first location, and the first window size, the fifth dummy mask assignment comprising at least one of an assignment to at least one of the one or more masks or the undetermined assignment.

In some embodiments, a first dummy mask assignment is assigned to the first dummy based on a second polygon of the one or more polygons comprising a second mask assignment to a second mask of the one or more masks and a second polygon area corresponding to the second mask. In other words, a dummy mask assignment is assigned to a dummy based on a first polygon and a second polygon comprising different mask assignments, for example. In some embodiments, a mask layout is received and comprises at least one of a full mask assignment or a partial mask assignment.

Figure 16:
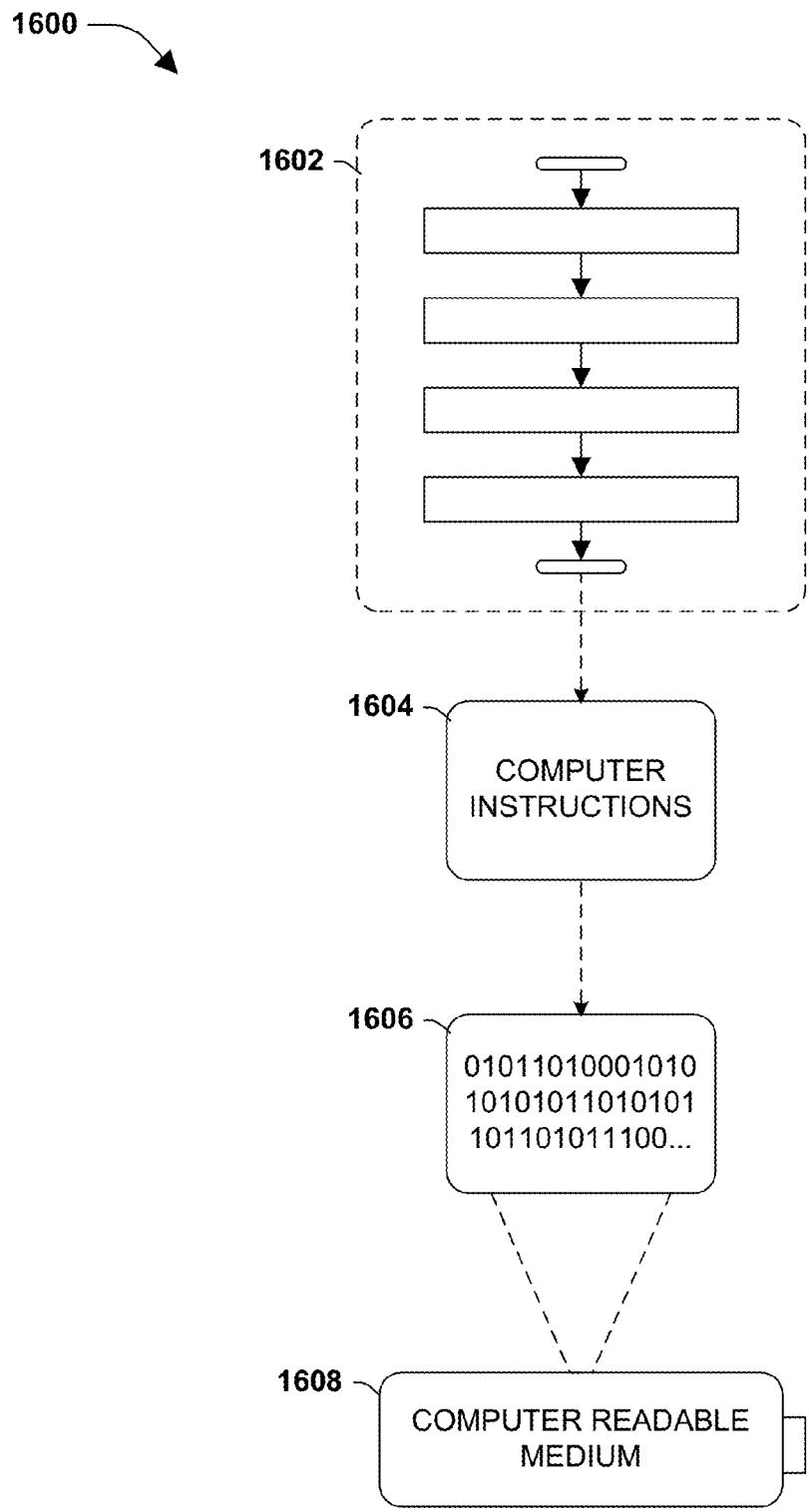
FIG. 16 is an illustration of an example computer-readable medium or computer-readable device comprising processor-executable instructions configured to embody one or more of the provisions set forth herein, according to some embodiments.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 16, wherein the implementation 1600 comprises a computer-readable medium 1608, such as a CD-R, DVD-R, flash drive, a platter of a hard disk drive, etc., on which is encoded computer-readable data 1606. This computer-readable data 1606, such as binary data comprising at least one of a zero or a one, in turn comprises a set of computer instructions 1604 configured to operate according to one or more of the principles set forth herein. In one such embodiment 1600, the processor-executable computer instructions 1604 is configured to perform a method 1602, such as at least some of the exemplary method 1200 of FIG. 12, at least some of exemplary method 1400 of FIG. 14, or at least some of the exemplary method 1500 of FIG. 15, for example. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

As used in this application, the terms "component", "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, or a computer. By way of illustration, both an application running on a controller and the controller can be a component. One or more components residing within a process or thread of execution and a component may be localized on one computer or distributed between two or more computers.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 17:
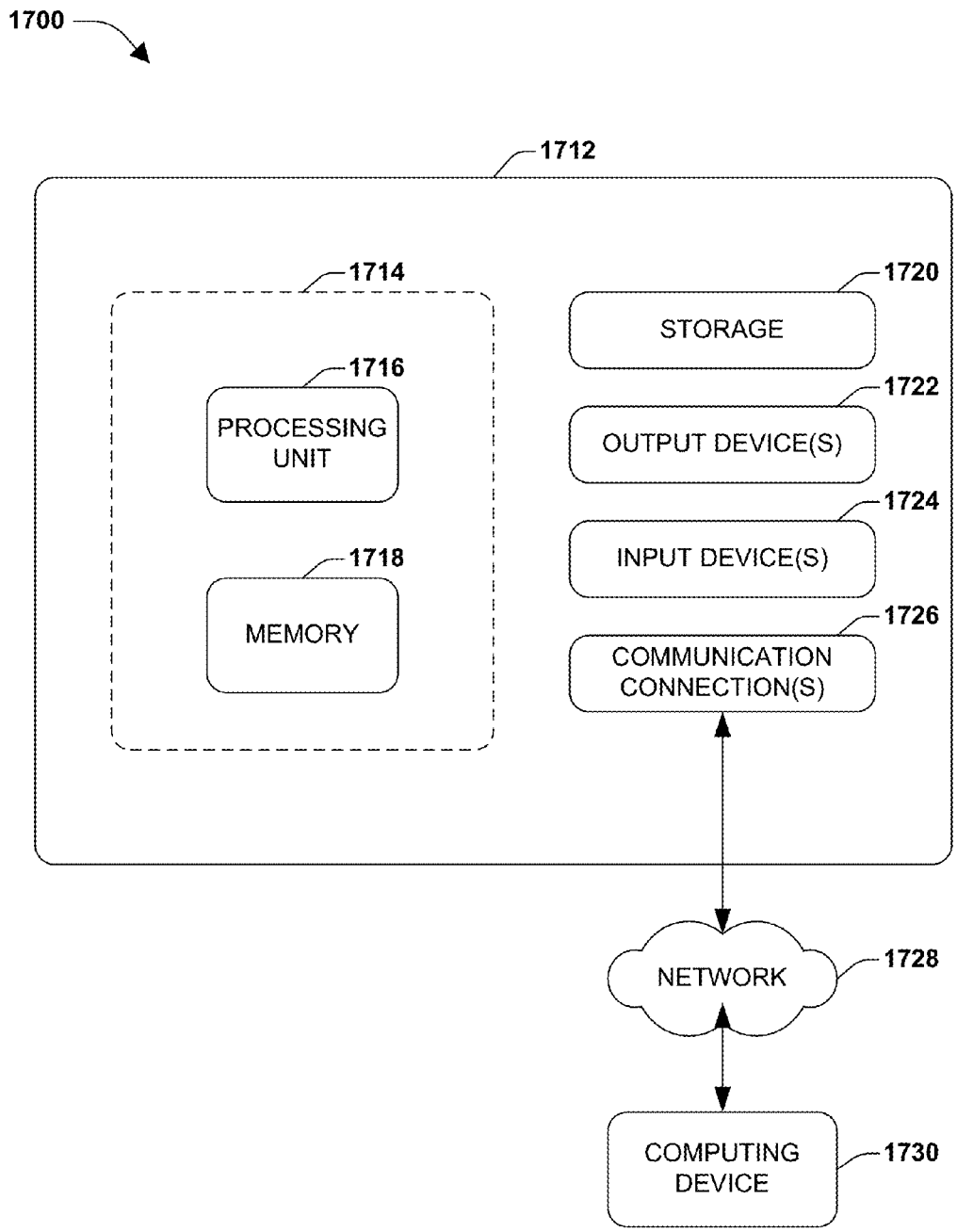
FIG. 17 is an illustration of an example computing environment where one or more of the provisions set forth herein are implemented, according to some embodiments.

FIG. 17 and the following discussion provide a brief, general description of a suitable computing environment to implement embodiments of one or more of the provisions set forth herein. The operating environment of FIG. 17 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 17 illustrates an example of a system 1700 comprising a computing device 1712 configured to implement one or more embodiments provided herein. In one configuration, computing device 1712 includes at least one processing unit 1716 and memory 1718. Depending on the exact configuration and type of computing device, memory 1718 may be volatile, such as RAM, non-volatile, such as ROM, flash memory, etc., or some combination of the two. This configuration is illustrated in FIG. 17 by dashed line 1714.

In other embodiments, device 1712 includes additional features or functionality. For example, device 1712 also includes additional storage such as removable storage or non-removable storage, including, but not limited to, magnetic storage, optical storage, and the like. Such additional storage is illustrated in FIG. 17 by storage 1720. In some embodiments, computer readable instructions to implement one or more embodiments provided herein are in storage 1720. Storage 1720 also stores other computer readable instructions to implement an operating system, an application program, and the like. Computer readable instructions are loaded in memory 1718 for execution by processing unit 1716, for example.

The term "computer readable media" as used herein includes computer storage media. Computer storage media includes volatile and nonvolatile, removable and non-removable media implemented in any method or technology for storage of information such as computer readable instructions or other data. Memory 1718 and storage 1720 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 1712. Any such computer storage media is part of device 1712.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 1712 includes input device(s) 1724 such as keyboard, mouse, pen, voice input device, touch input device, infrared cameras, video input devices, or any other input device. Output device(s) 1722 such as one or more displays, speakers, printers, or any other output device are also included in device 1712. Input device(s) 1724 and output device(s) 1722 are connected to device 1712 via a wired connection, wireless connection, or any combination thereof. In some embodiments, an input device or an output device from another computing device are used as input device(s) 1724 or output device(s) 1722 for computing device 1712. Device 1712 also includes communication connection(s) 1726 to facilitate communications with one or more other devices.

According to some aspects, a method for balancing mask loading within a semiconductor processing environment is provided, comprising receiving a mask layout associated with one or more masks, the mask layout comprising one or more polygons, a first polygon of the one or more polygons comprising a mask assignment to a first mask of the one or more masks. In some embodiments, the method comprises determining a first polygon area corresponding to the first mask based on the first polygon comprising the mask assignment to the first mask. Additionally, the method comprises assigning a first dummy mask assignment to a first dummy of one or more dummies in the mask layout based on the first polygon area, the first dummy mask assignment comprising at least one of an assignment to at least one of the one or more masks or an undetermined assignment, thus balancing mask loading within the semiconductor processing environment.

According to some aspects, a method for balancing mask loading within a semiconductor processing environment is provided, comprising receiving a mask layout associated with one or more masks, the mask layout comprising one or more polygons, a first polygon of the one or more polygons comprising a first mask assignment to a first mask of the one or more masks. In some embodiments, the method comprises creating a first window comprising a first window size less than a mask size of the mask layout, the first window at a first location in the mask layout. Additionally, the method comprises creating a first halo comprising a first halo size of at least the first window size, the first halo at the first location in the mask layout, the first halo encompassing at least a portion of the first polygon when the first halo is at the first location. For example, the method comprises determining a first polygon area corresponding to the first mask based on the first polygon comprising the first mask assignment to the first mask, the first halo at the first location, and the first halo size. In some embodiments, the method comprises assigning a first dummy mask assignment to a first dummy of one or more dummies in the mask layout based on the first polygon area, the first window at the first location, and the first window size, the first dummy mask assignment comprising at least one of an assignment to at least one of the one or more masks or an undetermined assignment, thus balancing mask loading within the semiconductor processing environment.

According to some aspects, a computer-readable storage medium comprising computer-executable instructions, which when executed at least in part via a processing unit on a computer perform a method for balancing mask loading within a semiconductor processing environment is provided, comprising receiving a mask layout associated with one or more masks, the mask layout comprising one or more polygons, a first polygon of the one or more polygons comprising a mask assignment to a first mask of the one or more masks.

In some embodiments, the method comprises determining a first polygon area corresponding to the first mask based on the first polygon comprising the mask assignment to the first mask. Additionally, the method comprises assigning a first dummy mask assignment to a first dummy of one or more dummies in the mask layout based on the first polygon area, the first dummy mask assignment comprising at least one of an assignment to at least one of the one or more masks or an undetermined assignment. In some embodiments, the method comprises inserting at least some of the one or more dummies in the mask layout, thus balancing mask loading within the semiconductor processing environment.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A method for balancing mask loading within a semiconductor processing environment, comprising:
   receiving a mask layout associated with one or more masks, the mask layout comprising one or more polygons, a first polygon of the one or more polygons comprising a mask assignment to a first mask of the one or more masks;
   creating a first window comprising a first window size less than a mask size of the mask layout, the first window at a first location in the mask layout;
   creating a first halo comprising a first halo size of at least the first window size, the first halo at the first location in the mask layout;
   determining a first polygon area corresponding to the first mask based on a portion of the first polygon encompassed by the first halo;
   assigning a first dummy mask assignment to a first dummy of one or more dummies in the mask layout based on the first polygon area, the first dummy mask assignment comprising at least one of an assignment to at least one of the one or more masks or an undetermined assignment; and
   inserting at least some of the one or more dummies in the mask layout, thus balancing mask loading within the semiconductor processing environment, at least some of at least one of the receiving, the creating the first window, the creating the first halo, the determining, the assigning, or the inserting implemented at least in part via a processing unit.

2. The method of claim 1, comprising determining the first polygon area based on the first halo at the first location.

3. The method of claim 1, comprising determining the first dummy mask assignment based on the first window at the first location.

4. The method of claim 1, comprising shifting at least one of the first window or the first halo to a second location.

5. The method of claim 4, comprising determining the first polygon area based on the first halo at the second location.

6. The method of claim 4, comprising determining the first dummy mask assignment based on the first window at the second location.

7. The method of claim 4, comprising shifting at least one of the first window or the first halo to the second location based on at least one of a shift pattern or a random shift pattern.

8. The method of claim 1, comprising receiving the mask layout comprising at least one of a full mask assignment or a partial mask assignment.

9. A method for balancing mask loading within a semiconductor processing environment, comprising:
   receiving a mask layout associated with one or more masks, the mask layout comprising one or more polygons, a first polygon of the one or more polygons comprising a first mask assignment to a first mask of the one or more masks;
   creating a first window comprising a first window size less than a mask size of the mask layout, the first window at a first location in the mask layout;
   creating a first halo comprising a first halo size of at least the first window size, the first halo at the first location in the mask layout, the first halo encompassing at least a portion of the first polygon when the first halo is at the first location;
   determining a first polygon area corresponding to the first mask based on the first polygon comprising the first mask assignment to the first mask, the first halo at the first location, and the first halo size;
   assigning a first dummy mask assignment to a first dummy of one or more dummies in the mask layout based on the first polygon area, the first window at the first location, and the first window size, the first dummy mask assignment comprising at least one of an assignment to at least one of the one or more masks or an undetermined assignment; and
   inserting at least some of the one or more dummies in the mask layout, thus balancing mask loading within the semiconductor processing environment, at least some of at least one of the receiving, the creating the first window, the creating the first halo, the determining, the assigning, or the inserting implemented at least in part via a processing unit.

10. The method of claim 9, comprising:
    creating a second window comprising a second window size less than the mask size of the mask layout, the second window at a second location in the mask layout, a second polygon of the one or more polygons comprising a second mask assignment to the first mask of the one or more masks;

creating a second halo comprising a second halo size of at least the second window size, the second halo at the second location in the mask layout, the second halo encompassing at least a portion of the second polygon when the second halo is at the second location;

determining a second polygon area corresponding to the first mask based on the second polygon comprising the second mask assignment to the first mask, the second halo at the second location, and the second halo size; and assigning a second dummy mask assignment to a second dummy of the one or more dummies in the mask layout based on the second polygon area, the second window at the second location, and the second window size, the second dummy mask assignment comprising at least one of the one or more masks or the undetermined assignment.

11. The method of claim 10, comprising:

shifting at least one of the first window or the first halo to a third location; and shifting at least one of the second window or the second halo to a fourth location.

12. The method of claim 11, comprising:

determining a third polygon area corresponding to the first mask based on a third polygon of the one or more polygons comprising a third mask assignment to the first mask, the first halo encompassing at least a portion of the third polygon when the first halo is at the third location, and the first halo size; and determining a fourth polygon area corresponding to the first mask based on a fourth polygon of the one or more polygons comprising a fourth mask assignment to the first mask, the second halo encompassing at least a portion of the fourth polygon when the second halo is at the fourth location, and the second halo size.

13. The method of claim 12, comprising:

assigning a third dummy mask assignment to a third dummy of the one or more dummies in the mask layout based on the third polygon area, the first window at the third location, and the first window size, the third dummy mask assignment comprising at least one of an assignment to at least one of the one or more masks or the undetermined assignment; and assigning a fourth dummy mask assignment to a fourth dummy of the one or more dummies in the mask layout based on the fourth polygon area, the second window at the fourth location, and the second window size, the fourth dummy mask assignment comprising at least one of an assignment to at least one of the one or more masks or the undetermined assignment.

14. The method of claim 9, comprising:

determining a fifth polygon area corresponding to a second mask of the one or more masks based on a fifth polygon of the one or more polygons comprising a fifth mask assignment to the second mask of the one or more masks, the first halo encompassing at least a portion of the fifth polygon when the first halo is at the first location, and the first halo size; and assigning a fifth dummy mask assignment to a fifth dummy of the one or more dummies in the mask layout based on the fifth polygon area, the first window at the first location, and the first window size, the fifth dummy mask assignment comprising at least one of an assignment to at least one of the one or more masks or the undetermined assignment.

15. The method of claim 9, comprising assigning the first dummy mask assignment to the first dummy based on a second polygon of the one or more polygons comprising a second mask assignment to a second mask of the one or more masks and a second polygon area corresponding to the second mask.

16. The method of claim 9, comprising assigning the first dummy mask assignment to the first dummy based on a total number of dummies.

17. The method of claim 9, comprising receiving the mask layout comprising at least one of a full mask assignment or a partial mask assignment.

18. A non-transitory computer-readable storage medium comprising computer-executable instructions, which when executed at least in part via a processing unit on a computer perform a method for balancing mask loading within a semiconductor processing environment, comprising:

receiving a mask layout associated with one or more masks, the mask layout comprising one or more polygons, a first polygon of the one or more polygons comprising a mask assignment to a first mask of the one or more masks;

creating a first window comprising a first window size less than a mask size of the mask layout, the first window at a first location in the mask layout;

creating a first halo comprising a first halo size of at least the first window size, the first halo at the first location in the mask layout;

determining a first polygon area corresponding to the first mask based on a portion of the first polygon encompassed by the first halo;

assigning a first dummy mask assignment to a first dummy of one or more dummies in the mask layout based on the first polygon area, the first dummy mask assignment comprising at least one of an assignment to at least one of the one or more masks or an undetermined assignment; and inserting at least some of the one or more dummies in the mask layout, thus balancing mask loading within the semiconductor processing environment.

19. The non-transitory computer-readable storage medium of claim 18, the inserting comprising:

inserting the first dummy within a region of the mask layout occupied by the first window.

20. The non-transitory computer-readable storage medium of claim 18, the first dummy mask assignment comprising an assignment to a second mask of the one or more masks.

* * * * *